(12) United States Patent
Ranjan et al.

(10) Patent No.: US 8,917,543 B2
(45) Date of Patent: Dec. 23, 2014

(54) MULTI-STATE SPIN-TORQUE TRANSFER MAGNETIC RANDOM ACCESS MEMORY

(71) Applicant: Avalanche Technology, Inc., Fremont, CA (US)

(72) Inventors: Rajiv Yadav Ranjan, San Jose, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 37 days.

(21) Appl. No.: 13/893,311

(22) Filed: May 13, 2013

(65) Prior Publication Data

US 2013/0258764 A1 Oct. 3, 2013

Related U.S. Application Data

(63) Continuation of application No. 12/397,255, filed on Mar. 3, 2009, now abandoned, and a continuation-in-part of application No. 11/678,515, filed on Feb. 23, 2007, now Pat. No. 8,058,696.

(51) Int. Cl.

| G11C 11/00 | (2006.01) |
|---|---|
| H01L 43/08 | (2006.01) |
| G11C 11/16 | (2006.01) |
| H01L 27/22 | (2006.01) |
| G11C 11/56 | (2006.01) |
| H01L 43/02 | (2006.01) |

(52) U.S. Cl.
CPC ............ *H01L 43/02* (2013.01); *H01L 43/08* (2013.01); *G11C 11/16* (2013.01); *H01L 27/228* (2013.01); *G11C 11/1675* (2013.01); *G11C 11/5607* (2013.01); *G11C 2211/5615* (2013.01); *Y10S 977/933* (2013.01); *Y10S 977/935* (2013.01)
USPC ............ 365/158; 365/171; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5
See application file for complete search history.

(56) References Cited

U.S. PATENT DOCUMENTS

| 6,937,497 B1 * | 8/2005 | Ju et al. ..................... 365/130 |
| 7,345,852 B2 * | 3/2008 | Inomata et al. ............ 360/314 |
| 2002/0036331 A1 * | 3/2002 | Nickel et al. ............... 257/421 |

* cited by examiner

*Primary Examiner* — Harry W Byrne
(74) *Attorney, Agent, or Firm* — Maryam Imam; IPxLaw Group LLP

(57) ABSTRACT

A multi-state spin-torque transfer magnetic random access memory (STTMRAM) is formed on a film and includes a first magnetic tunneling junctions (MTJ) having a first fixed layer, a first sub-magnetic tunnel junction (sub-MTJ) layer and a first free layer. The first fixed layer and first free layer each have a first magnetic anisotropy. The STTMRAM further includes a non-magnetic spacing layer formed on top of the first MTJ layer and a second MTJ formed on top of the non-magnetic spacing layer. The second MTJ has a second fixed layer, a second sub-MTJ layer and a second free layer. The second fixed and second free layers each have a second magnetic anisotropy, wherein at least one of the first or second magnetic anisotropy is perpendicular to the plane of the film.

11 Claims, 19 Drawing Sheets

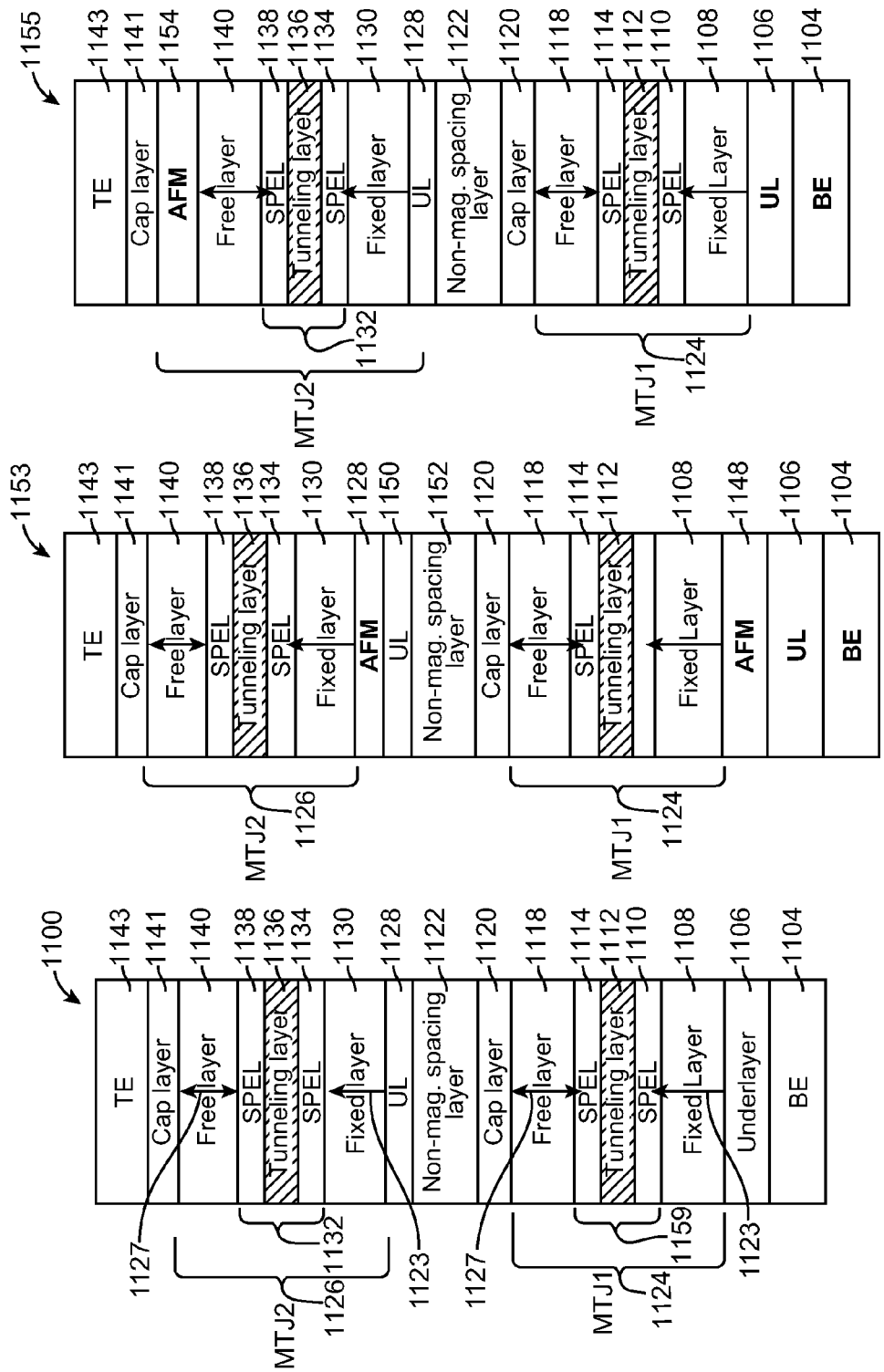

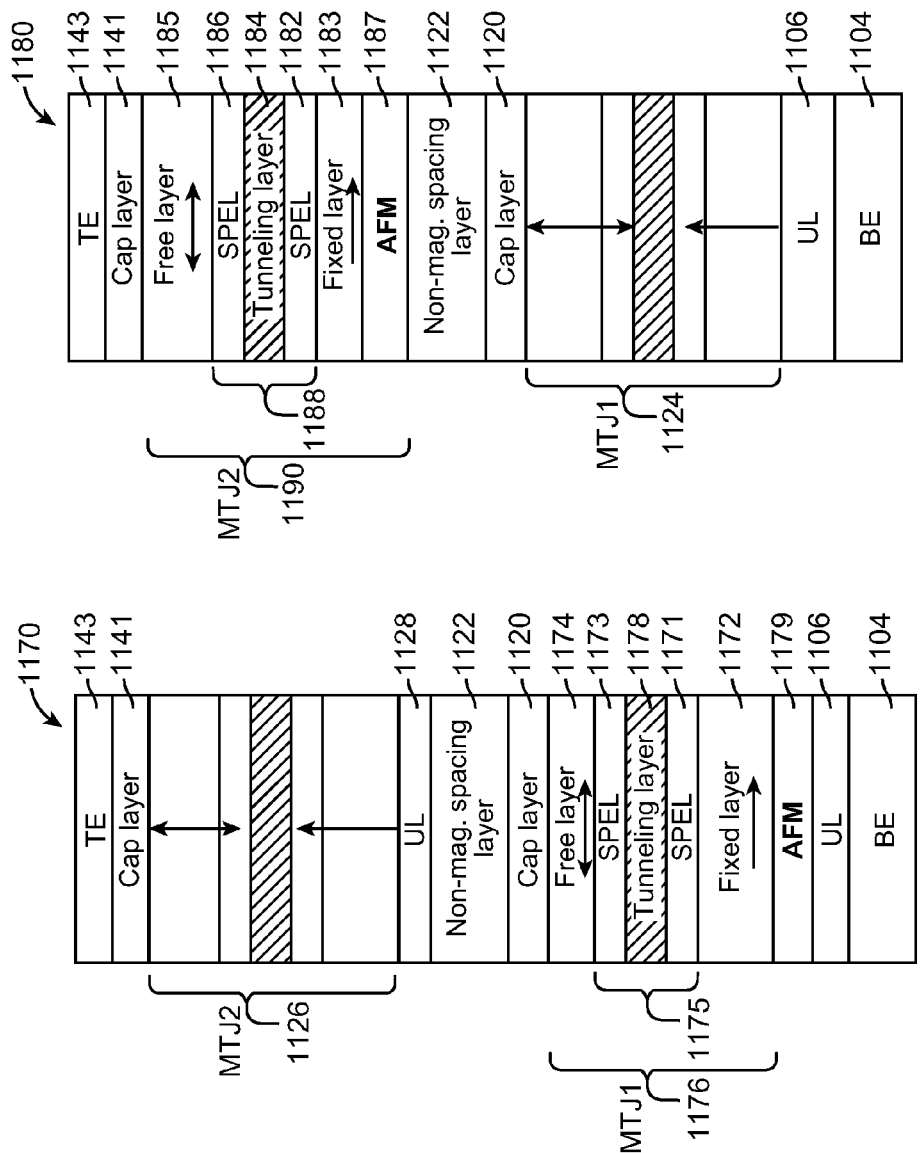

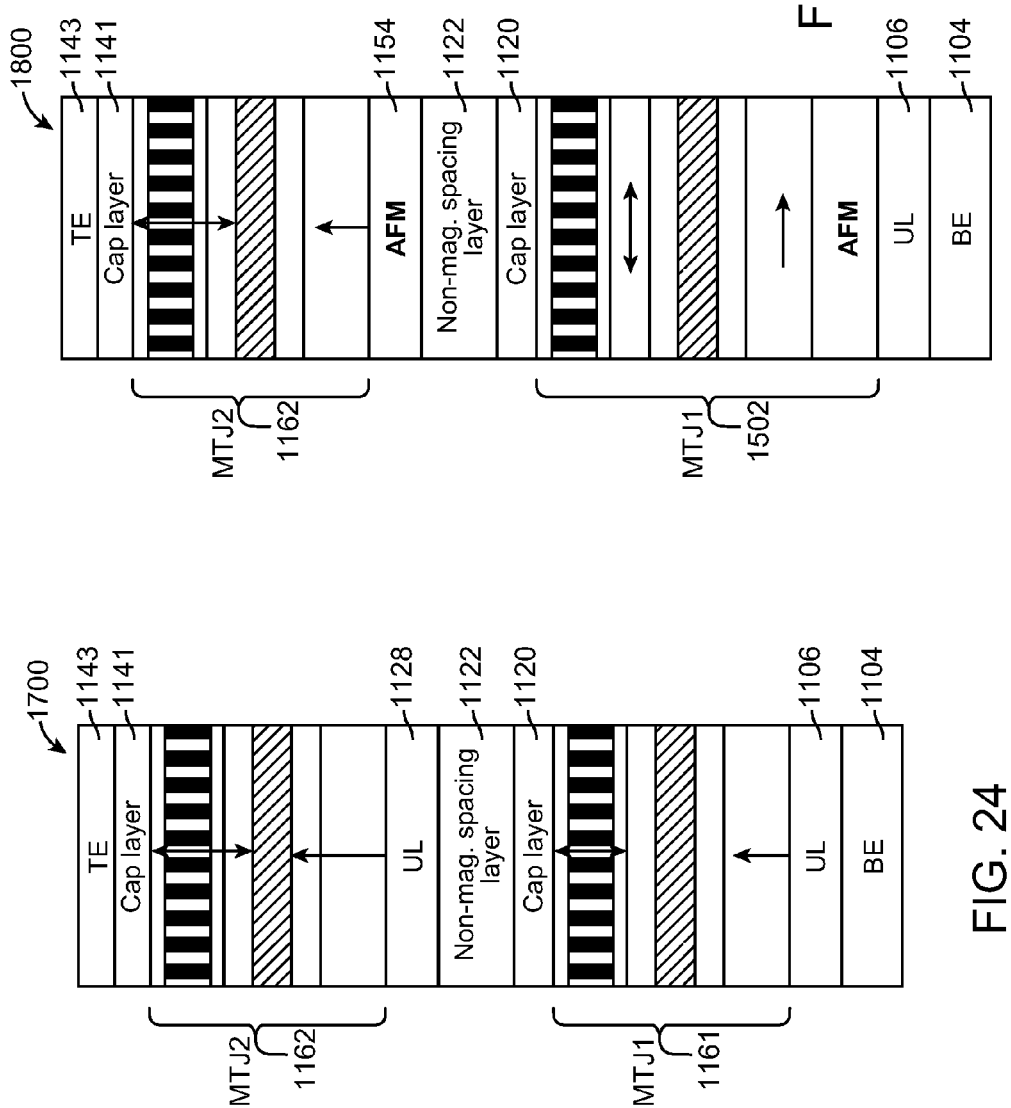

MLC cell with two or more stacked MTJ with different anisotrophy.

| I density | | 100 | n= 2 | | Parallel | Anti-parallel |
|---|---|---|---|---|---|---|
| Anisotrophy ratio | | | 2 | R(KΩ) large | 1 | 2 |
| | Large | Small | | R(KΩ) small | 2 | 4 |
| Fixed layers | Free layer 1 | Free layer 2 | State | | Total R | Prog I (uA) |
| → | → | → | 1 | | 3 | 200 |
| → | → | ← | 2 | | 5 | -50 |
| → | ← | ← | 3 | | 6 | -200 |
| → | ← | → | 4 | | 4 | 50 |

Table 1

MLC cell with two or more MTJs side by side with different anisotrophy.

| I density | | 50 | n= 2 | | Parallel | Anti-parallel |
|---|---|---|---|---|---|---|
| Anisotrophy ratio | | | 1.3 | R(KΩ) large | 3 | 6 |
| | Small | Large | | R(KΩ) small | 3.9 | 7.8 |
| Fixed layer | Free layer | Free layer | State | | Total R | Prog I (uA) |
| → | → | → | 1 | | 1.70 | -134.5 |
| → | → | ← | 2 | | 2.36 | 50 |
| → | ← | ← | 3 | | 3.39 | 134.5 |
| → | ← | → | 4 | | 2.17 | -50 |

| From one state to another | 1 to 2 | 2 to 3 | 3 to 4 | |
|---|---|---|---|---|
| R differences | 0.67 | 1.03 | 1.22 | 0.47 |
| between different states | | | | |

Table 2

MULTI-STATE SPIN-TORQUE TRANSFER MAGNETIC RANDOM ACCESS MEMORY

CROSS REFERENCE TO RELATED APPLICATIONS

This application is a continuation of U.S. patent application Ser. No. 12/397,255, filed on Mar. 3, 2009, by Rajiv Yadav Ranjan, and entitled "A MULTI-STATE SPIN-TORQUE TRANSFER MAGNETIC RANDOM ACCESS MEMORY", which is a continuation-in-part of U.S. patent application Ser. No. 11/678,515 filed on Feb. 23, 2007, by Rajiv Yadav Ranjan and entitled "A High Capacity Low Cost Multi-State Magnetic memory" and U.S. patent application Ser. No. 11/866,830, filed on Oct. 3, 2007, by Rajiv Yadav Rajiv and entitled "An Improved High Capacity Low Cost Multi-State Magnetic Memory" and U.S. application Ser. No. 11/860,467, filed on Sep. 24, 2007, by Rajiv Yadav Ranjan and entitled "Low Cost Multi-State Magnetic Memory" and a continuation-in-part of U.S. patent application Ser. No. 11/674,124 entitled "Non-Uniform Switching Based Non-Volatile Magnetic Base Memory", filed on Feb. 12, 2007, the disclosure of which is incorporated herein by reference, as though set forth in full.

BACKGROUND OF THE INVENTION

1. Field of the Invention

The present invention relates generally to non-volatile magnetic memory and particularly to multi-state magnetic memory having stacked magnetic tunnel junction (MTJ) with at least one MTJ having a storage layer with a magnetization direction being substantially perpendicular to the plane of the wafer (or substrate).

2. Description of the Prior Art

It has become clear that non-volatile memories, such as non-volatile random access memories (NVRAMs) are finding increasingly new applications, and that their notoriety would not only continue but that it would explode due to the increasing demands in mobile devices and other applications. It is also believed that current volatile DRAM will be replaced by the current-switching version or spin-torque transfer magnetic random access memory (STTMRAM), in the coming future.

It is really important that in order for STTMRAM to gain broad acceptance, the cost of the memory and hence the cell size to be smaller and scalable to smaller feature size such as below 65 nm.

One of the ways to achieve higher density is by storing more than one bit of digital information in a memory cell of magnetic memory designs. Such memory cells are commonly referred to as multi-state (or multi-level) cells (MLCs). Current MLC designs include magnetic memory with a storage layer with a magnetization direction that is in-plane or parallel to the plane of the substrate or wafer. Such MLCs suffer from low density and therefore higher costs.

Stated differently, current STTMRAM designs have storage layers with a magnetization direction that is parallel to the plane of the substrate. One of the key challenges for such type of designs using in-plane magnetization is that they cannot be scaled to lower feature sizes such as below 65 nm. This is primarily because as the feature size reduces, the reduced memory bit size (for example: for 90 nm, the memory bit size is 90 nm×180 nm, but for 45 nm this would be 45 nm×90 nm) becomes thermally unstable due to the reduction in the volume. The Perpendicular STTMRAM enables lower switching current (therefore lower program current), higher thermal stability and higher density.

Moreover, perpendicular STTMRAM does not require in-plane elongated memory bit like in the case of in-plane STTMRAM, mentioned above. In-plane circular shape or square shape is typically preferred for perpendicular STTMRAM over an elongated shape because in the latter, features pose large manufacturing challenges especially at lower lithography geometry, such as below 90 nm. On the other hand, circular shape memory bit shapes allow for lower lithography and higher capacity memory, making the perpendicular STTMRAM a preferred choice for future applications. It should be pointed out that the perpendicular STTMRAM can utilize high anisotropy magnetic alloys as compared to the STTMRAM having in-plane magnetization, leading to higher thermal stability and thereby enabling scalability down to below 30 nm.

What is needed is a multi-state current-switching version or spin-torque magnetic random access memory (STTMRAM) having stacked magnetic tunnel junctions (MTJs).

SUMMARY OF THE INVENTION

To overcome the limitations in the prior art described above, and to overcome other limitations that will become apparent upon reading and understanding the present specification, the present invention discloses a method and a corresponding structure for a multi-state magnetic storage memory device that is based on current-induced-magnetization-switching having reduced switching current with high thermal stability in the magnetic memory.

Briefly, an embodiment of the present invention includes a multi-state spin-torque transfer magnetic random access memory (STTMRAM) is formed on a film and includes a first magnetic tunneling junctions (MTJ) having a first fixed layer, a first sub-magnetic tunnel junction (sub-MTJ) layer and a first free layer. The first fixed layer and first free layer each have a first magnetic anisotropy. The STTMRAM further includes a non-magnetic spacing layer formed on top of the first MTJ layer and a second MTJ formed on top of the non-magnetic spacing layer. The second MTJ has a second fixed layer, a second sub-MTJ layer and a second free layer. The second fixed and second free layers each have a second magnetic anisotropy, wherein at least one of the first or second magnetic anisotropy is perpendicular to the plane of the film.

These and other objects and advantages of the present invention will no doubt become apparent to those skilled in the art after having read the following detailed description of the preferred embodiments illustrated in the several figures of the drawing.

IN THE DRAWINGS

Figure 3:
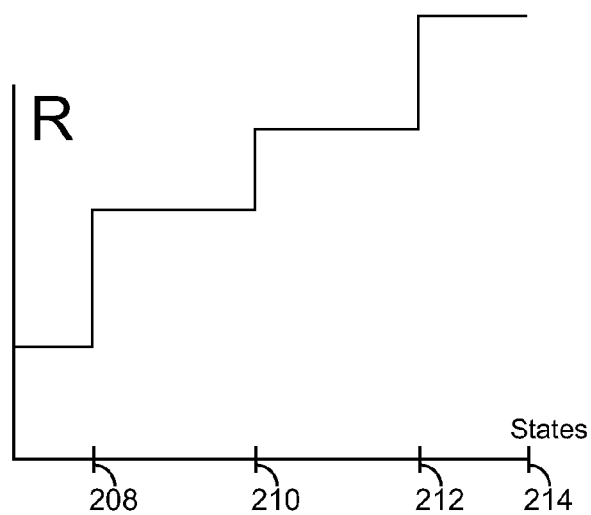

FIG. 3 shows a graph of the level of resistance (R) of each of the layers 118, 114, 110 and 106 (shown in the y-axis) vs. the state of the memory element 100.

Figure 4:
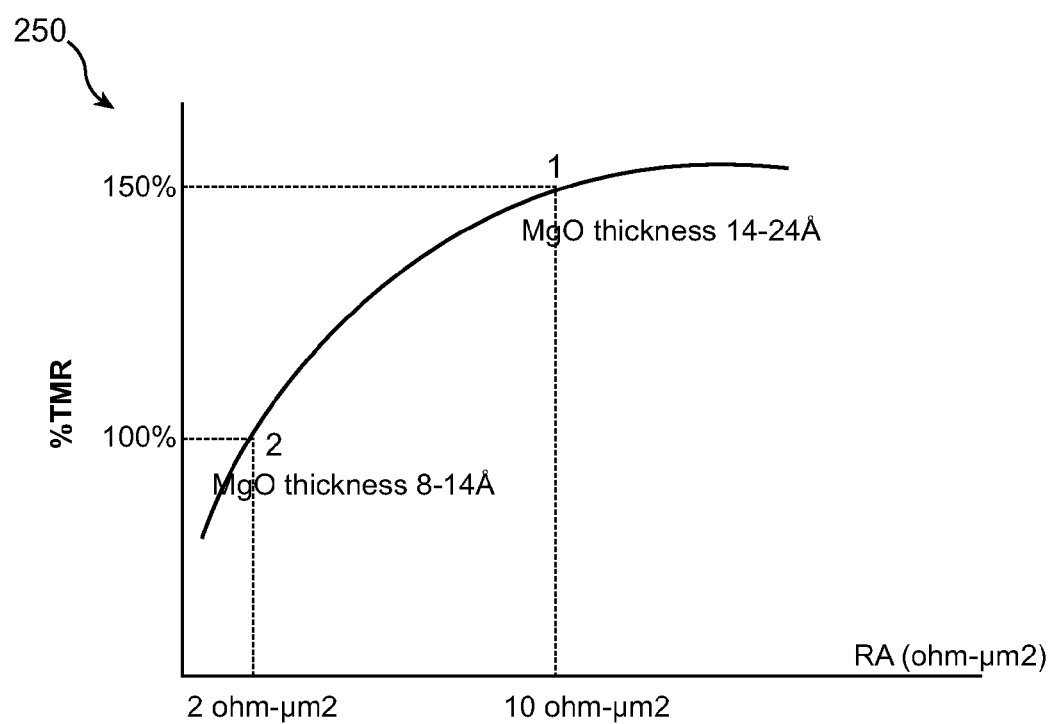

FIG. 4 shows a graph 250 of the tunneling magneto resistance (TMR), shown in the y-axis, vs. the resistance area (RA).

FIG. 5 shows.

Figure 5:
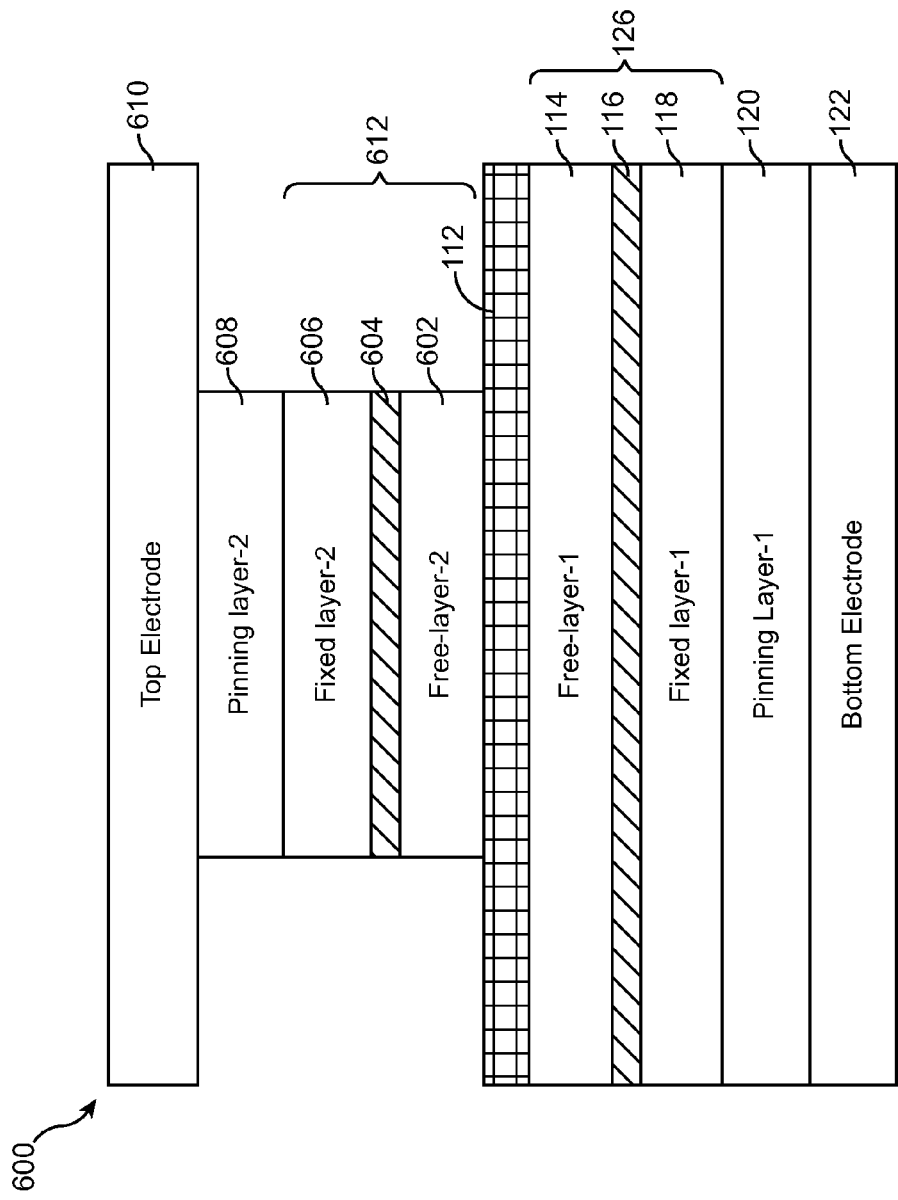

FIG. 5 shows relevant layers of a multi-state current-switching magnetic memory element 600 are shown, in accordance with another embodiment of the present invention.

Figure 6:
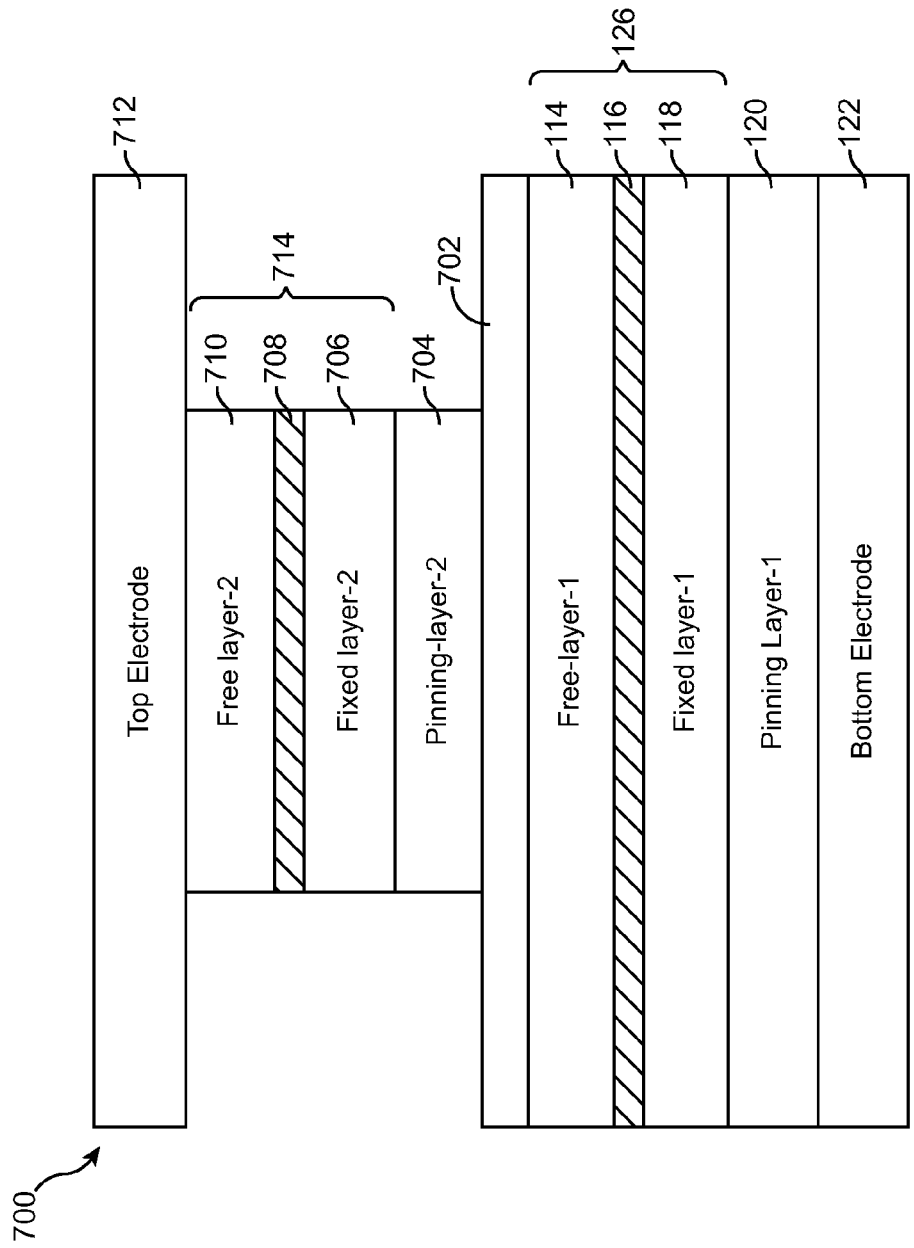

FIG. 6 shows relevant layers of a multi-state current-switching magnetic memory element 700, in accordance with yet another embodiment of the present invention.

Figure 7:
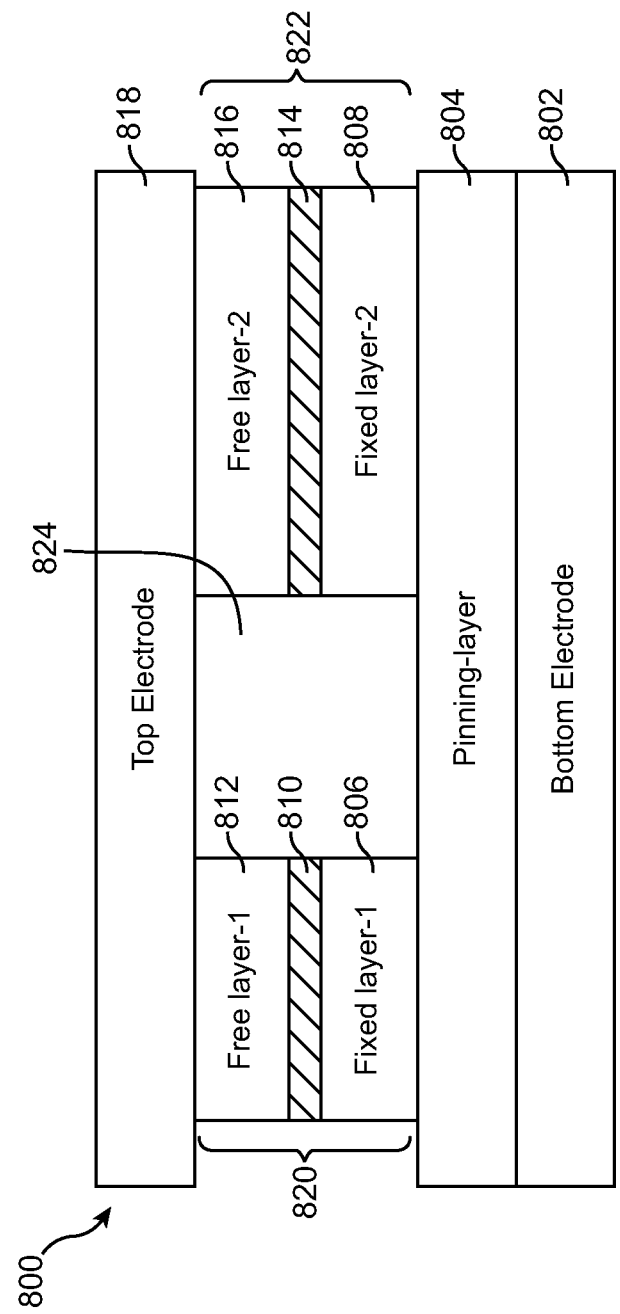

FIG. 7 shows relevant layers of a multi-state current-switching magnetic memory element 800, in accordance with still another embodiment of the present invention.

Figure 8:
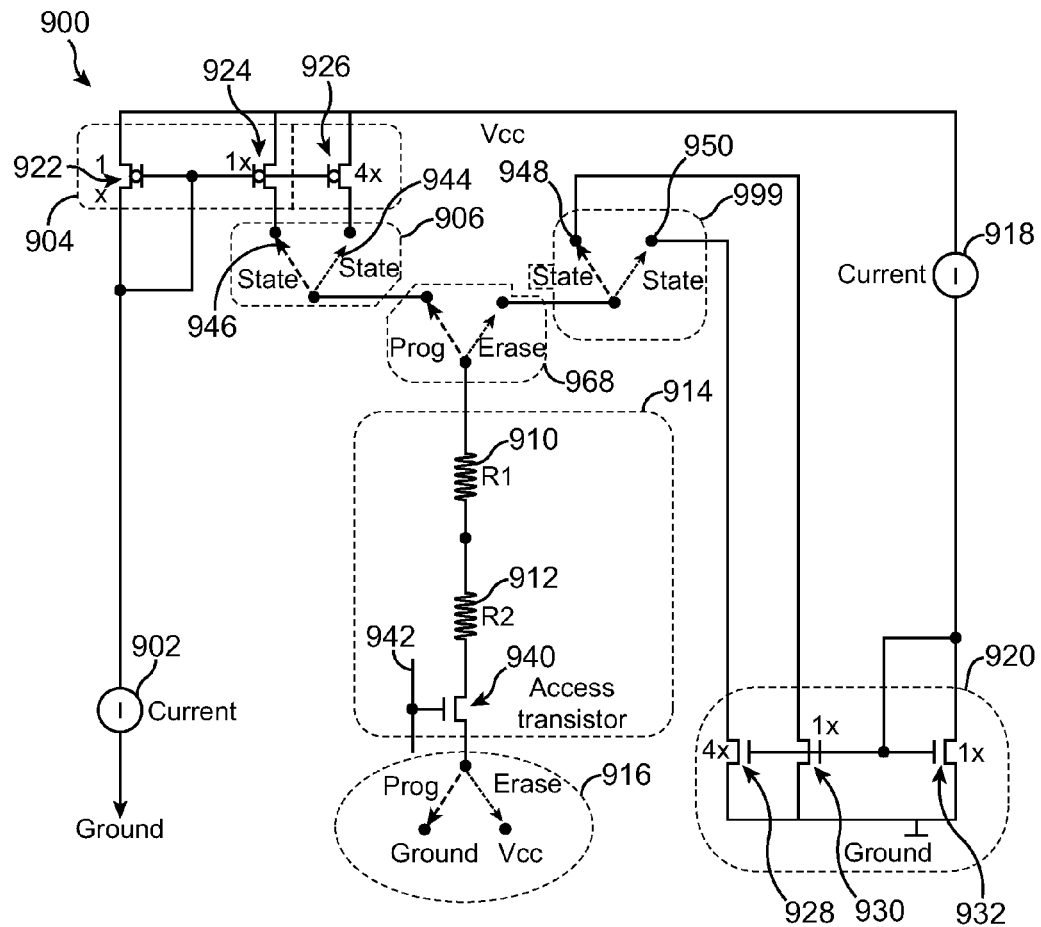

FIG. 8 shows a program/erase circuit for programming and/or erasing the memory elements of the various embodiments of the present invention.

Figure 9:
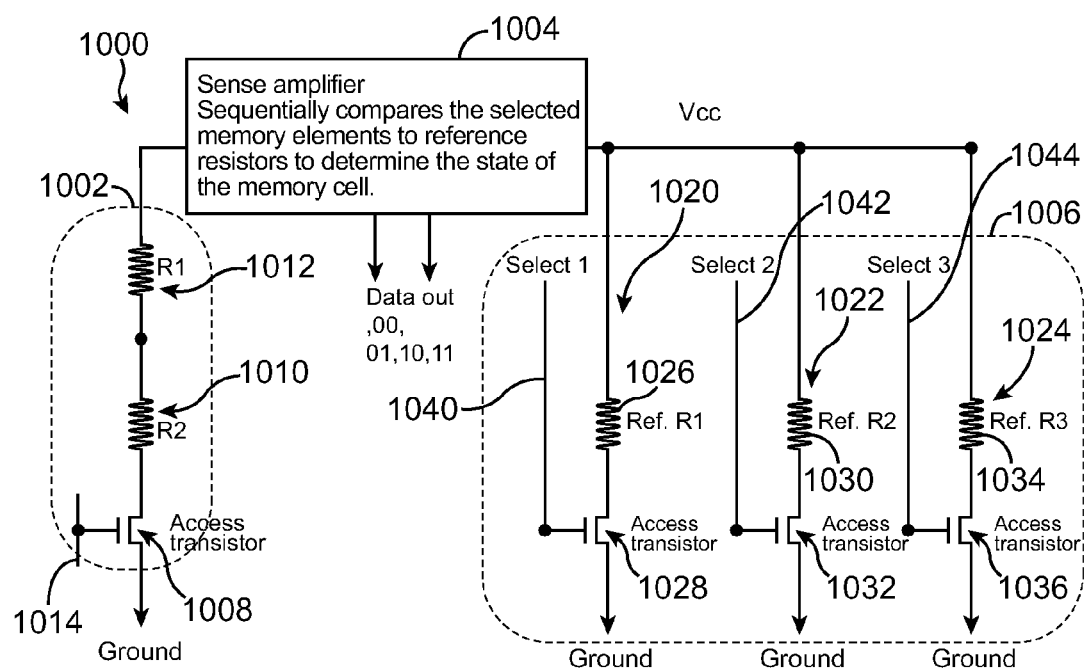

FIG. 9 shows a read circuit for reading the memory elements of the various embodiments of the present invention.

FIG. 10 shows relevant layers of multi-state STTMRAM 1100, in accordance with an embodiment of the present invention.

FIG. 11 shows relevant layers of multi-state STTMRAM 1153, in accordance with an embodiment of the present invention.

FIG. 12 shows relevant layers of multi-state STTMRAM 1155, in accordance with an embodiment of the present invention.

Figure 13:
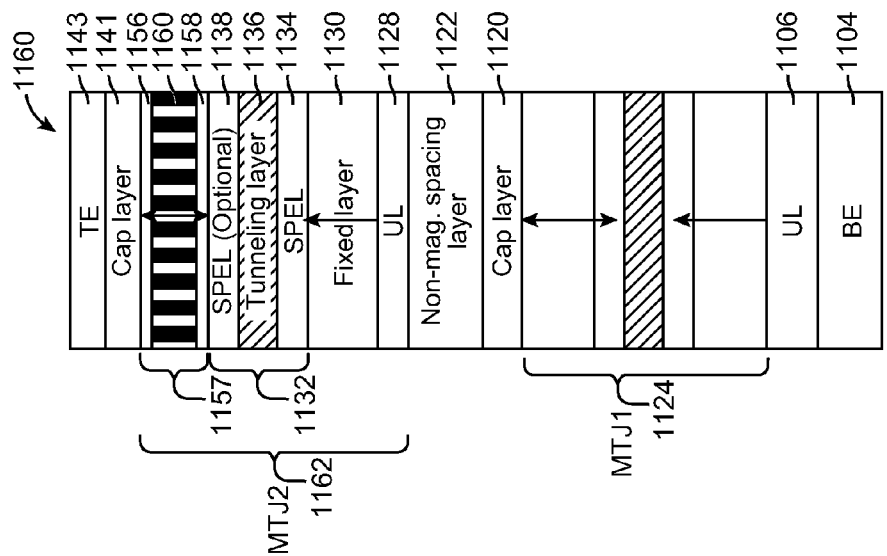

FIG. 13 shows relevant layers of multi-state STTMRAM 1160, in accordance with an embodiment of the present invention.

Figure 14:
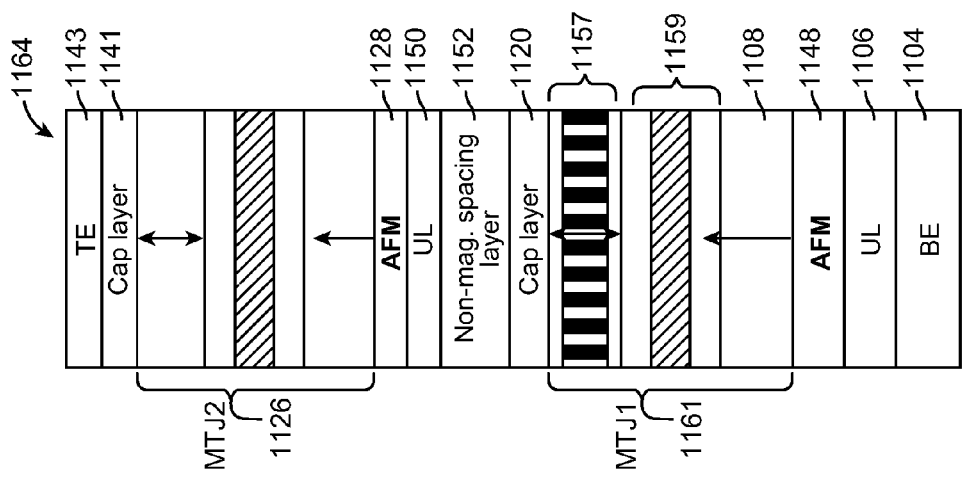

FIG. 14 shows relevant layers of multi-state STTMRAM 1164, in accordance with an embodiment of the present invention.

Figure 15:
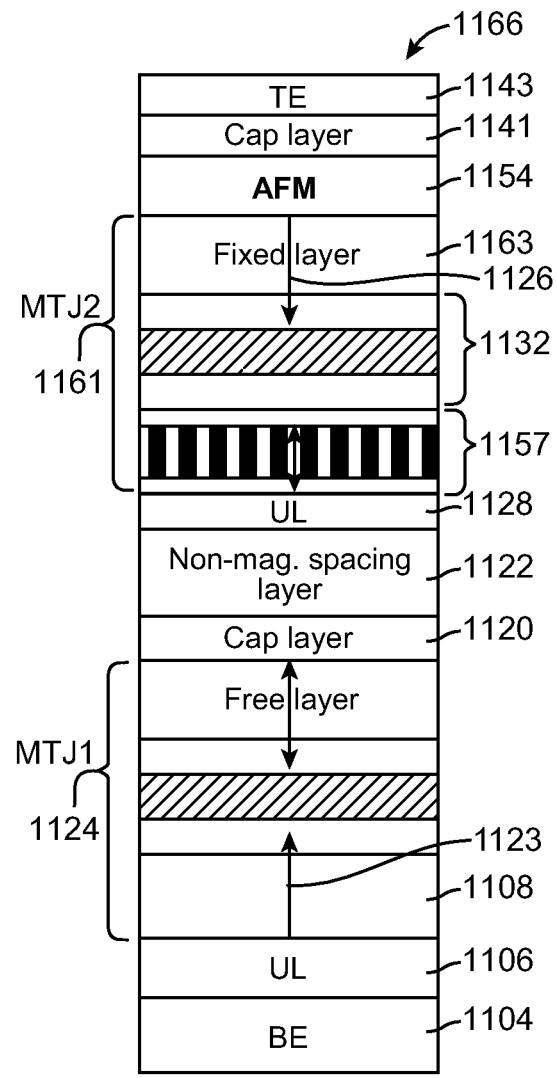

FIG. 15 shows relevant layers of multi-state STTMRAM 1166, in accordance with an embodiment of the present invention.

FIG. 16 shows relevant layers of multi-state STTMRAM 1170, in accordance with an embodiment of the present invention.

FIG. 17 shows relevant layers of multi-state STTMRAM 1180, in accordance with an embodiment of the present invention.

Figures 18, 19:
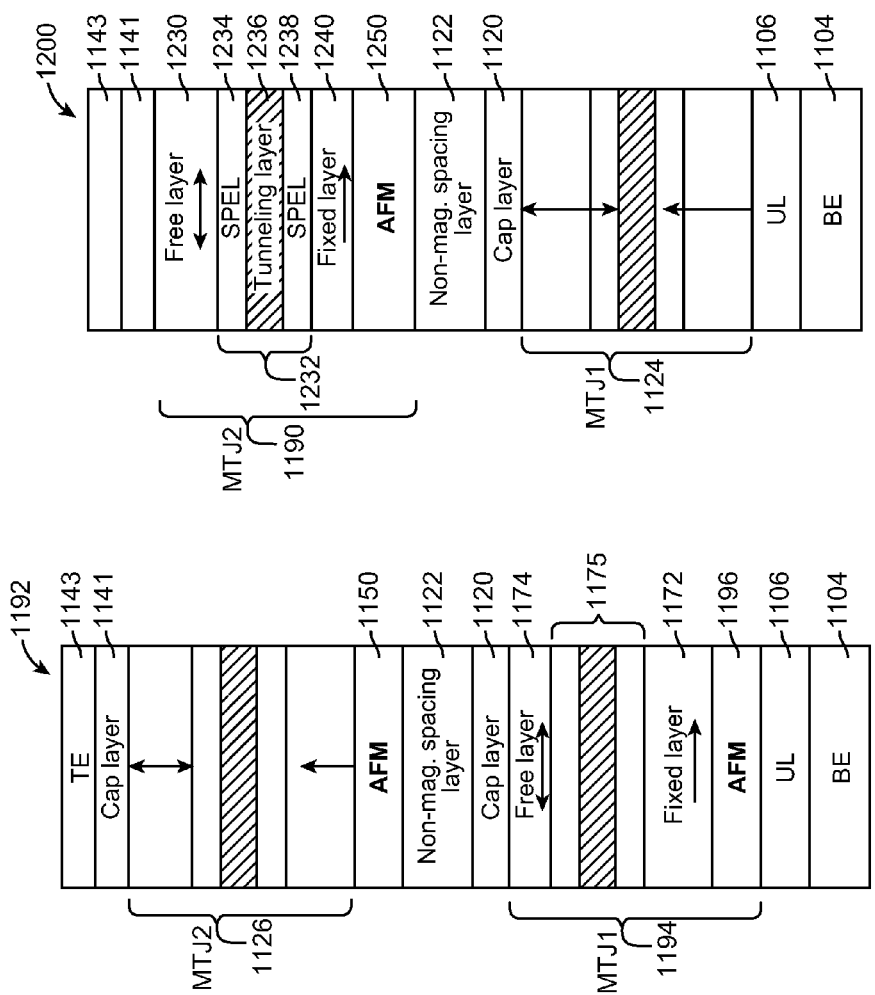

FIG. 18 shows relevant layers of multi-state STTMRAM 1192, in accordance with an embodiment of the present invention.

FIG. 19 shows relevant layers of multi-state STTMRAM 1200, in accordance with an embodiment of the present invention.

Figures 20, 21:
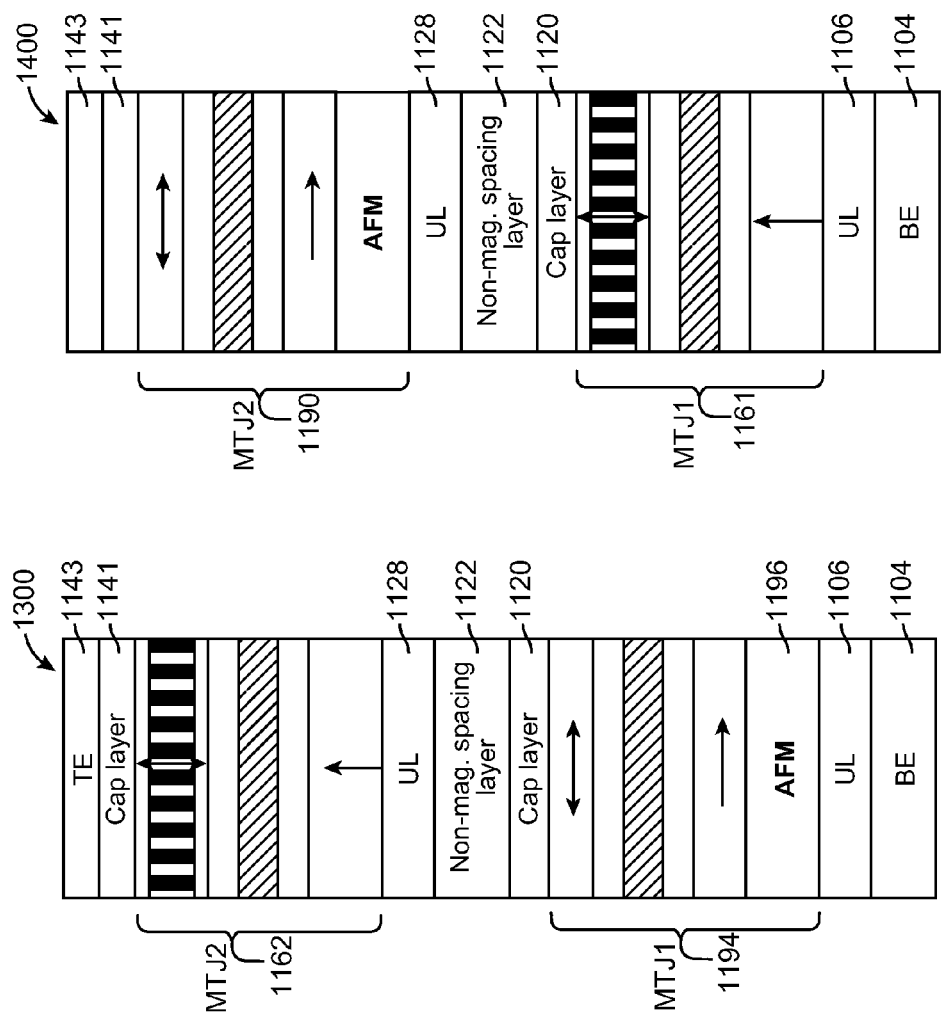

FIG. 20 shows relevant layers of multi-state STTMRAM 1300, in accordance with an embodiment of the present invention.

FIG. 21 shows relevant layers of multi-state STTMRAM 1400, in accordance with an embodiment of the present invention.

Figure 22:
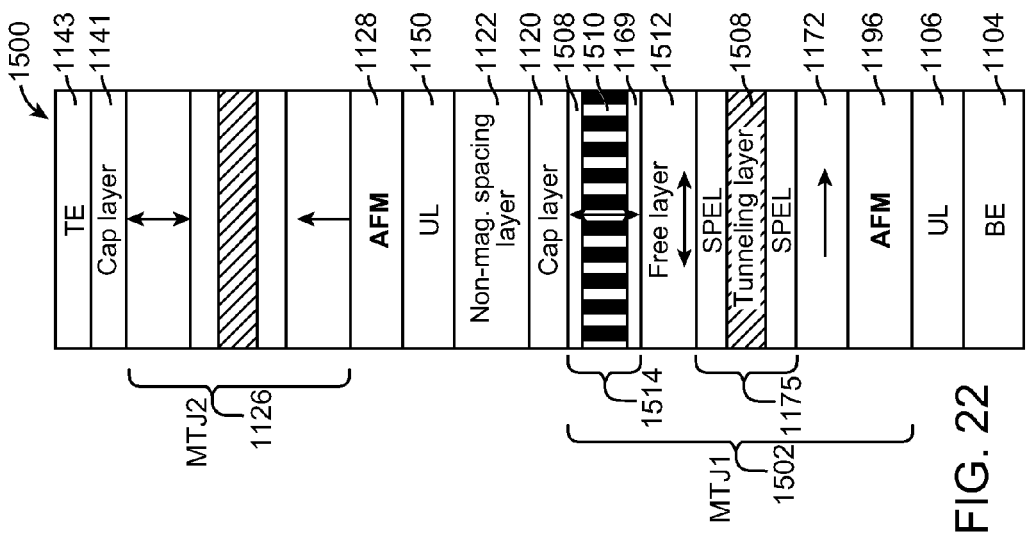

FIG. 22 shows relevant layers of multi-state STTMRAM 1500, in accordance with an embodiment of the present invention.

Figure 23:
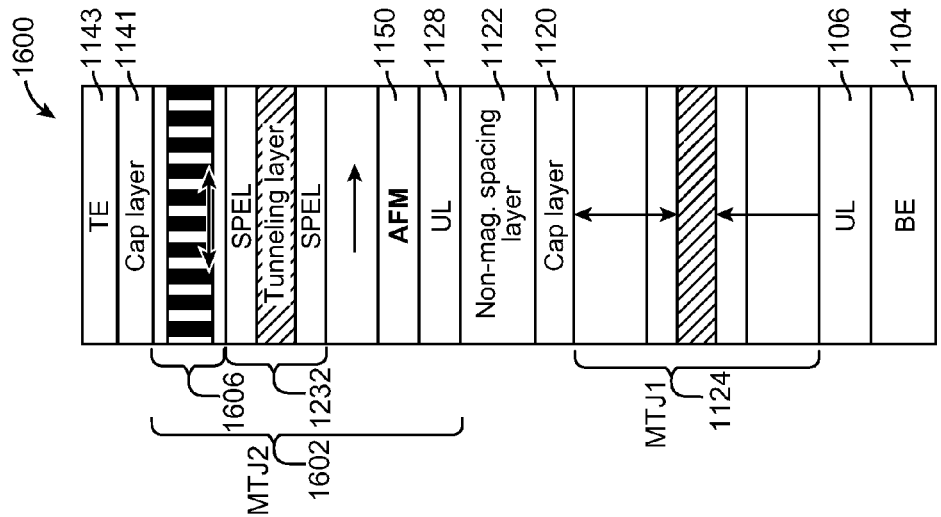

FIG. 23 shows relevant layers of multi-state STTMRAM 1600, in accordance with an embodiment of the present invention.

FIG. 24 shows relevant layers of multi-state STTMRAM 1700, in accordance with an embodiment of the present invention.

FIG. 25 shows relevant layers of multi-state STTMRAM 1800, in accordance with an embodiment of the present invention.

Figure 26:
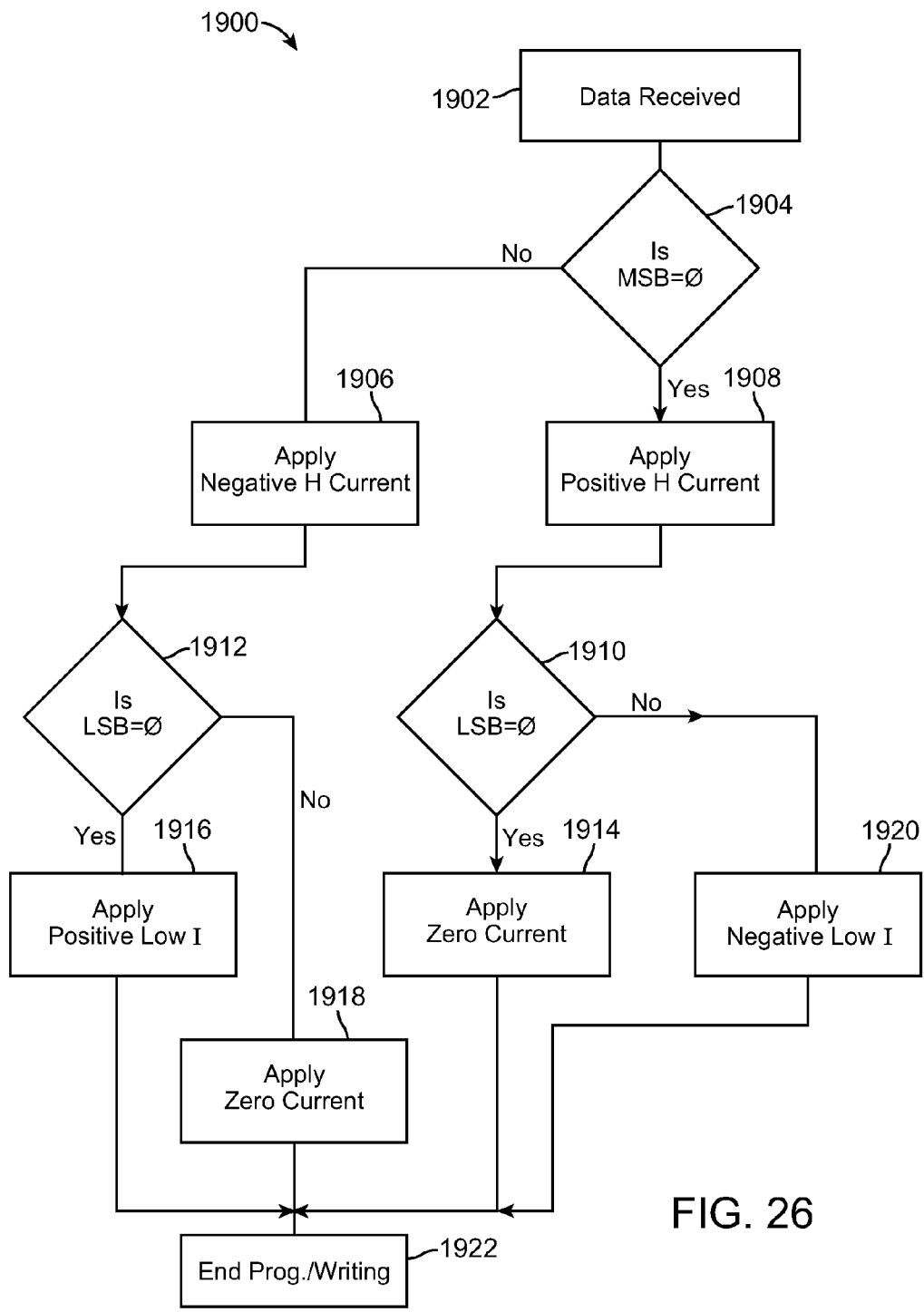

FIG. 26 shows a flow chart of the steps performed, during a write or program operation, to write/program the multi-state STTMRAM, in accordance with an embodiment of the present invention.

Figure 27A:
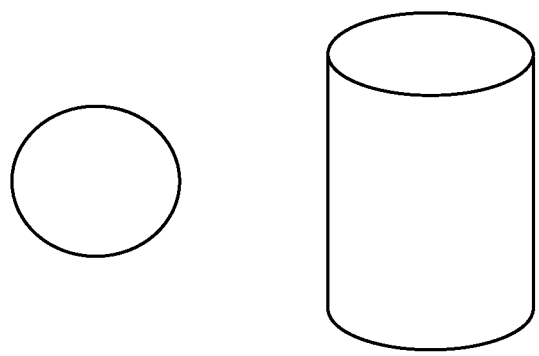

FIG. 27(a) shows top-down or in-plane view and side-view of shapes that any of the STTMRAMs 1100, 1153, 1155, 1160, 1164, 1166 or 1700 can have when their free and fixed layers have perpendicular magnetic orientation.

Figure 27B:
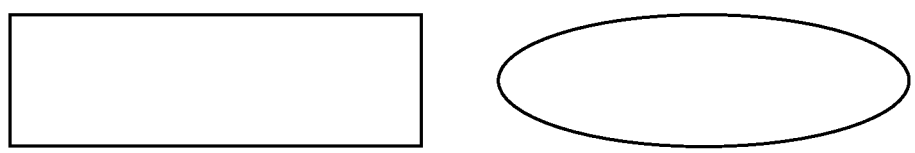

FIG. 27(b) shows top-down or in-plane view and side-view of shapes that any of the STTMRAMs 1100, 1153, 1155, 1160, 1164, 1166 or 1700 can have when their free and fixed layers have in-plane magnetic orientation.

Figure 1:
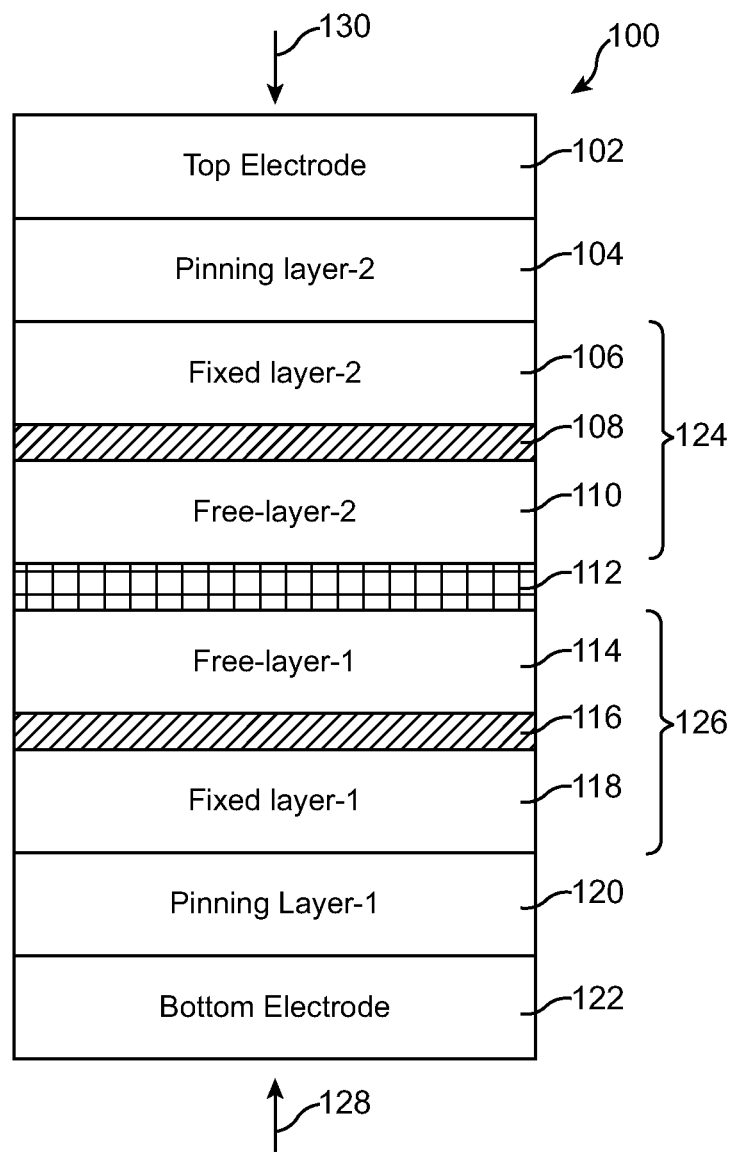
FIG. 1 shows relevant layers of a multi-state current-switching magnetic memory element 100 are shown, in accordance with an embodiment of the present invention.

Table 1 shows certain exemplary characteristics of the embodiments of FIGS. 1, 5 and 6.

Table 2 shows certain exemplary characteristics of the embodiment of FIG. 7.

DETAILED DESCRIPTION OF EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

In an embodiment of the present invention, a multi-state magnetic memory cell is disclosed. In one embodiment of the present invention, a stack of magnetic tunnel junction (MTJ) is formed, each MTJ being formed of at least three layers, a barrier layer formed between a fixed layer and a free layer, each MTJ being separated from another by a conductive layer, the stack forming a multi-state magnetic memory cell for storing at least two bits of digital information.

Referring now to FIG. 1, relevant layers of a multi-state current-switching (or spin-torque) magnetic memory element 100 are shown, in accordance with an embodiment of the present invention. The memory element 100 is shown to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, on top of which is shown formed a free layer 110, on top of which is shown formed a barrier layer 108, on top of which is shown formed a fixed layer 106, on top of which is shown formed a pinning layer 104, on top of which is shown formed a top electrode 102. The top electrode 102 and the bottom electrode 122 are each made of Tantalum (Ta) in an exemplary embodiment although other suitable materials are contemplated. The layers 114, 116 and 118 are shown to form a MTJ 126 separated by the layer 112 from an MTJ 124, which is formed from the layers 106, 108 and 110. The MTJ 124 and 126 form the relevant parts of a stack of memory elements. In fact, while two MTJs are shown to form the stack of FIG. 1, other number of MTJs may be stacked for storing additional bits of information.

In FIG. 1, the MTJ 126 is for storing a bit of information or two states, '1' and '0', while the MTJ 124 is for storing another bit of information and since each bit represents two binary states, i.e. '1' and '0', two bits represent four binary states, generally represented as '00', '01', '10', '11', or 0, 1, 2 and 3 in decimal notation, respectively. The memory element 100 advantageously stores two bits of information thereby decreasing the real estate dedicated for memory and further increases system performance. This is particularly attractive for embedded memory applications. Additionally, manufacturing is made easier and less costly and scalability is realized.

In FIG. 1, the barrier layers of each of the MTJs, such as the layer 116 acts as a filter for electrons with different spins giving rise to different amounts of tunneling current for electrons with different spins thereby causing two unique resistance values associated with each MTJ for two different orientations of the free layer. In the case where additional MTJs are employed, each MTJ similarly has associated therewith, a unique resistance value.

In one embodiment of the present invention, the thickness of the layers 108 and 116 to cause the MTJs 124 and 126 to have different resistances and therefore capable of storing more than one bit.

Examples of materials used to form each of the layers of the memory element 100 will now be presented. It should be noted that these materials are merely examples and other types of materials may be employed. The layers 104 and 120, are each typically formed substantially of IrMn or PtMn or NiMn or any other material including Manganese (Mn). The layers 106 and 118 are typically formed substantially of a magnetic material. Examples of such magnetic material include CoFeB or CoFe/Ru/CoFeB. The layers 108 and 116 are each made substantially of a non-magnetic material, an example of which is magnesium oxide (MgO). The layer 112 is a non-magnetic layer made substantially of, for example, NiNb, NiP, NiV or CuZr. The layer 112 serves to insulate the two MTJs 124 and 126 from one another. In an embodiment employing more than two MTJs, another layer, such as the layer 112 would be formed on top of the layer 104 or on the bottom of the layer 120. The layers 110 and 114 are each made of CoFeB containing oxides intermixed. The layers 110 and 114 are substantially amorphous in an at-deposited state. The top electrode 102 and the bottom electrode 122 are each made of tantalum (Ta), in one embodiment of the present invention, however, other types of conductive material may be employed.

The layers 120 and 104 are anti-ferromagnetic (AF) coupling layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 are permanently fixed.

Other choices of material for the layers 108 and 116 are aluminum oxide (Al2O3) and titanium oxide (TiO2). A thin-layer of one of the constituent elements may be deposited prior to the deposition of the barrier oxide layer. For example, a 2-5 A thick Mg layer may be deposited prior to the deposition of the layers 108 and 116. This limits any damage of the magnetic-free layer from intermixing of the elements during deposition. The layer 112 is a non-magnetic layer which is substantially amorphous made of, for example, Nickel niobium (NiNb), Nickel phosphorous (NiP), Nickel vanadium (NiV), Nickel bororn (NiB) or copper-zirconium (CuZr). It should be noted that the composition of these alloys is chosen in such a way that the resulting alloy becomes substantially amorphous, for example, for nickel niobium (NiNb), the typical Nb content is maintained between 30 to 70 atomic percent and for nickel phosphorous (NiP) the phosphorous (P) content is maintained between 12 and 30 atomic percent. The layer 112 serves to isolate the two MTJs 124 and 126 from one another. In an embodiment of the present invention, which employs more than two MTJs, another layer, such as the layer 112 would be formed on top of the layer 104 or on the bottom of the layer 120. The layers 110 and 114 are each made of CoFeB containing oxides intermixed. The layers 110 and 114 are substantially amorphous in an as-deposited state. The top and the bottom electrodes are typically made of tantalum (Ta).

The layers 120 and 104 are anti-ferromagnetic (AF) coupling layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 are permanently fixed. This is typically done by a magnetic annealing process following the deposition of all the layers and involves heating the wafer consisting of at least one memory element 100 under the application of a substantially uni-axial magnetic field of over 5 kilo-Oersteds and a temperature of over 350 degree centigrade for typically 2 hours. This annealing process also serves to re-crystallize the layers 108 and 116 and their respective adjacent free layers 110 and 114. This process is essential for making high performing magnetic tunnel junctions.

Typical thicknesses for each of the layers of the memory element 100 are now presented. However, these sizes are merely examples, as other thicknesses are anticipated. A typical thickness of each of the top electrode 102 and the bottom electrode 122 is 30 to 200 nm. While a preferred thickness is typically 50 nm, the actual thickness choice may depend on the requirements from the metallization process. The layers 104 and 120 are typically 20 to 100 nm in thickness with a preferred thickness of 25-50 nm. The layers 108 and 118 are typically made of three layers of Cobalt-Iron (CoFe)/Ruthenium (Ru)/Cobalt-Iron-Boron (CoFeB) with CoFe layer being placed adjacent to the layers 104 and 120. The typical thickness of the CoFe layer is 3 to 10 nm, Ru layer is 0.6 to 1.0 nm to create anti-ferromagnetic coupling between the two adjacent magnetic layers of CoFe and CoFeB. The CoFeB layer is typically 2 to 10 nm thick with a preferred range of 2.5 to 5 nm. The free layers 110 and 114 are typically 2 to 7 nm thick with a preferred range of 2-5 nm and may contain a 1-2 nm thick layer of Co—Fe-oxide inter-dispersed in that layer in order to get low switching current during current induced switching. The barrier layers 108 and 116 are typically 0.8 to 3 nm. It is very likely that the two barrier layers may have slightly different thickness, for example layer 116 can be 1.5 to 2.5 nm thick while the second barrier layer 108 may be 0.8 to 1.2 nm thick, and vice-versa. Additionally, the thickness and the amounts of oxide in the free-layers 110 and 114 may be different by a factor of 1.5 or higher. The non-magnetic layer 112 is typically 2 to 50 nm thick with a preferred range being 2 to 10 nm. It should be pointed out that while the [most] preferred material choice of the non-magnetic isolation layer 112 consists of amorphous non-magnetic alloys, a crystalline non-magnetic alloy may also work.

During manufacturing, the layers of the memory element 100 are formed in the manner described hereinabove. Additionally, an annealing process, which is well known, is performed heating the memory element 100 in the presence of a magnetic field after which channels are formed in each of the layers 108 and 116. Following the annealing process, the fixed layers 106 and 118 are oriented in a particular orientation, and the layers 108 and 116 well as the layers 110 and 114, take on crystalline characteristics.

During operation, current is applied, in a perpendicular direction relative to the plane of the paper of FIG. 1, either from a direction indicated by the arrow 128 or a direction indicated by the arrow 130. When current is applied, depending on the level of current, the magnetic moment of the layers 110 and 114 are each caused to be switched to an opposite direction, or not. Since the MTJs 124 and 126 are made with different aspect ratios (or anisotropy), the switching current is different for these two MTJs. For example, in one embodiment of the present invention, the aspect ratio for MTJ 124 is approximately 1:1.3 to 1:1.5 while the aspect ratio for the MTJ 126 is approximately 1:2 to 1:2.5. Therefore, the switching current for the MTJ 126 is 3-5 times higher than that of the MTJ 124, in the foregoing embodiment. At high current levels both MTJs switch magnetic orientation, while at low current levels only the MTJ 124 having the smaller aspect ratio switches.

The state of the magnetic moment of each of the layers of the MTJ defines the state of the memory element 100. As the layers 104 and 120 each act as AF coupling layers, they pin or switch the magnetic moments of the their neighboring fixed layer, which, then, by the application of current, causes neighboring free layers to switch or not. More specifically, the layer 118 defines one state, the layer 114 defines another state, the layer 110 defines yet another state and the layer 106 defines still another state. For the sake of understanding, the states of each of the layers 118, 114, 110 and 106 are referred to as states 1, 2, 3 and 4, respectively.

Figure 2:
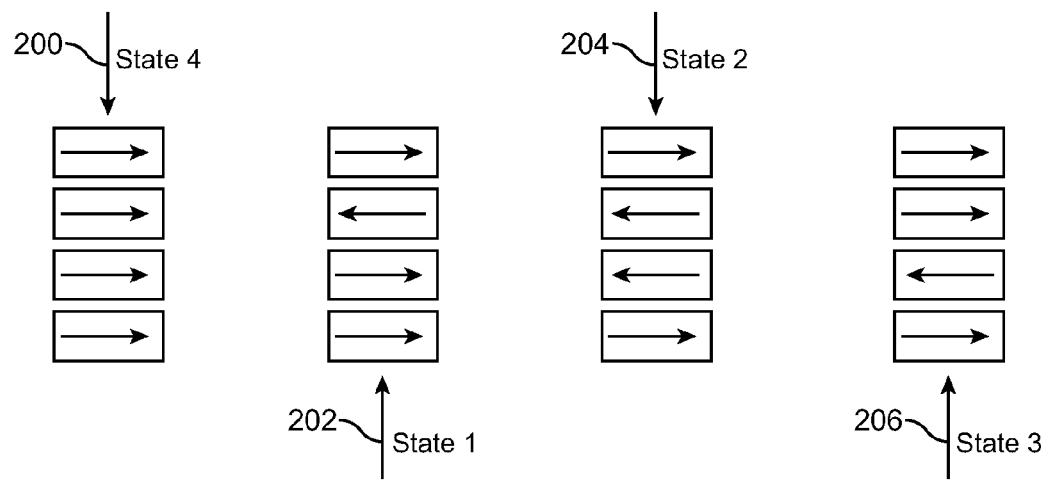
FIG. 2 shows various states of the memory element 100.

FIG. 2 shows various states of the memory element 100. Due to the use of two MTJs, four different states or two bits may be stored, therefore, the states 1-4 are shown. At each state, the directions of the arrows indicate the direction of the magnetic moments of free layers and pinning layers. The direction of the arrow 200 shows the direction of high current applied to the memory element 100 and in this case, the state of the memory element 100 is at an all '1's or all '0's state. The direction of the arrow 202 shows the direction of low current applied to the memory element 100 when at state 1. The direction of the arrow 204 shows the direction of high current applied to the memory element 100 when the latter is at state 2 and the direction of the arrow 206 shows the direction of low current applied to the memory element 100 when at state 3.

FIG. 3 shows a graph of the level of resistance (R) of each of the layers 118, 114, 110 and 106 (shown in the y-axis) vs. the state of the memory element 100. Thus, at, for example, at 208, the memory element 100 has taken on the state 1 (corresponding to 202 on FIG. 2), at 210, the memory element 100 has taken on the state 2 (corresponding to 204 on FIG. 2), at 212, the memory element 100 has taken on the state 3 (corresponding to 206 on FIG. 2), and at 214, the memory element 100 has taken on the state 4 (corresponding to 200 on FIG. 2). The level of resistance for each of these states is indicated in Table 1, at a column labeled "Total R". For example, at state 1, the R, in FIG. 3 is indicated as being 3 kilo ohms (K Ohms) by Table 1. At state 2, the R, in FIG. 3, is indicated as being 4 K Ohms and so on. The values used for resistance serve as examples only such that other values may be employed without departing from the scope and spirit of the present invention.

It should be noted that different aspect ratio or anisotropy associated with the different MTJs 124 and 126 causes the different switching of the MTJs, which results in two bits being stored in the memory element 100. In other embodiments, some of which will be shortly presented and discussed, the size of the barrier layers of the MTJs are changed to effectuate different resistances. In yet other embodiments, the size of the MTJs are changed to the same.

FIG. 4 shows a graph 250 of the tunneling magneto resistance (TMR), shown in the y-axis, vs. the resistance area (RA). The TMR is defined as:

$$TMR = (Rh - Rl)/Rl \qquad \text{Eq. (1)}$$

Wherein Rh is resistance at a high state and Rl is resistance at a low state.

The graph 250 of FIG. 4 serves merely as an example to convey the difference in TMR or percentage increase as the RA increases. For instance, at an RA of 2 ohm-micro-meters squared, the TMR is 100% while at a RA of 10, the TMR is 150% where the thickness of the barrier layer of the MTJ is between 14-24 Angstroms.

FIG. 5 shows relevant layers of a multi-state current-switching magnetic memory element 600 are shown, in accordance with another embodiment of the present invention. The memory element 600 is shown to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, as that shown in FIG. 1. As previously indicated, relative to FIG. 1, the MTJ 126 comprises the layers 114, 116 and 118. However, in the embodiment of FIG. 5, the MTJ 612, which is made of a free layer 602, a barrier layer 604 and a fixed layer 606, is smaller, in its planar dimension, than the MTJ 126 of FIG. 1, which causes the MTJ 612 to have a different resistance than that of the MTJ 126.

In FIG. 5, the free layer 602 is shown to be formed on top of the layer 112 and on top of the layer 602 is shown formed the layer 604, on top of which is shown formed the layer 606, on top of which is shown formed a pining layer 608, a top electrode 610. The MTJs 126 and 612 are shown separated by the layer 112. The MTJs 126 and 612 form the relevant parts of a stack of memory elements. In fact, while two MTJs are shown to form the stack of FIG. 5, other number of MTJs may be stacked for storing additional bits of information.

The difference in the planar dimension of the MTJs 612 to that of the MTJ 126 is approximately 1 to 10 and typically 1 to 3, in one embodiment of the present invention. The material for each of the layers of the memory element 600 may be the same as that of counterpart layers of the memory element 100. For example, the layer 602 is made of the same material as that of the layer 110 and the layer 604 is made of the same material as that of the layer 108 and the layer 606 is made of the same material as the layer 106 and the layer 608 is made of the same material as the layer 104. The top electrodes 610 and 102 are made of the same material. In another embodiment, the MTJ 612 may be larger, in size, in the same planar dimension, than the MTJ 126.

The operation of the embodiment of the embodiment of FIG. 5 is the same as that of FIG. 1.

FIG. 6 shows relevant layers of a multi-state current-switching magnetic memory element 700, in accordance with yet another embodiment of the present invention. The memory element 700 to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, as that shown in FIGS. 1 and 6. As previously indicated, relative to FIGS. 1 and 6, the MTJ 126 comprises the layers 114, 116 and 118. However, in the embodiment of FIG. 6, the MTJ 714, which is shown to comprise a free layer 710, a barrier layer 708 and a fixed layer 706, is shown to be smaller in its planar dimension than the MTJ 126 causing the MTJ 714 to have a different resistance than that of the MTJ 126.

The MTJs 126 and 714 are shown separated by the layers 702 and 704. Although the layer 704 serves to pin the layer 706 while the layer 702 serves to isolate the MTJ 126 and is an amorphous only to the layer 114. The layer 702, in one embodiment of the present invention, is made of two non-magnetic layers, such as Ta and/or an amorphous alloy, the same as Nickel-niobium (NiNb) or nickel-phosphorus (NiP). The MTJs 126 and 612 form the relevant parts of a stack of memory elements. In fact, while two MTJs are shown to form the stack of FIG. 5, other number of MTJs may be stacked for storing additional bits of information.

The difference in the planar dimension of the MTJs 714 to that of the MTJ 126 is 1 to 10, and typically 1 to 3 in one embodiment of the present invention. The material for each of the layers of the memory element 700 may be the same as the counterpart layers of the memory element 100 or that of the memory element 600. For example, the layer 710 is made of the same material as that of the layer 110 and the layer 708 is made of the same material as that of the layer 108 and the layer 706 is made of the same material as the layer 106 and the layer 704 is made of the same material as the layer 104. The top electrodes 712 and 102 are made of the same material. In another embodiment, the MTJ 714 may be larger in size in the same planar dimension, than the MTJ 126.

FIG. 7 shows relevant layers of a multi-state current-switching magnetic memory element 800, in accordance with still another embodiment of the present invention. In FIG. 7, the memory element 800 is shown to include a bottom electrode 802 on top of which is shown formed a pinning layer 804 on top of which is shown formed two fixed layers on either side thereof. That is, a fixed layer 806 is shown formed on one side of the layer 804 and a fixed layer 808 is shown formed on an opposite side of the layer 804.

In FIG. 7, two MTJs are shown formed on either side or top of the layer 804. Namely, an MTJ 820 is shown formed on one side of the layer 804 and another MTJ 822 is shown formed on an opposite side of the layer 804. The MTJ 820 includes the fixed layer 806, which is formed on top of the layer 804 and the barrier layer 810 shown formed on top of the layer 806 and the free layer 812 shown formed on top of the layer 810. The MTJ 822 is shown to include the fixed layer 808, which is formed on top of the layer 804 and the barrier layer 814, which is shown formed on top of the layer 808 and the free layer 816, which is shown formed on top of the layer 814. A top electrode 818 is shown formed on top of the MTJs 820 and 822, or more specifically on top of the layers 812 and 816. The top electrode 818 is typically made of two layers, such as Ta and a conductive, non-magnetic material.

In forming the memory element 800, the layer 804 is formed on top of the bottom electrode and the layers of the MTJs 820 and 822 are formed on top of the layer 804 and on top of the MTJs 820 and 822 is formed the top electrode 818. The layers of the MTJs 820 and 822 are formed uniformly and continuously on top of the layer 804 and a trench 824, which is basically an empty space or hole is formed, prior to depositing the top electrode 818, by etching through the layers of the MTJs 820 and 822. In this manner, the fixed layers of the MTJs 820 and 822 are the same layer prior to etching and the barrier layers of the MTJs 820 and 822 are the same layer prior to etching and the free layers of the MTJs 820 and 822 are the same layer prior to etching.

In one embodiment of the present invention, the trench 824 is filled with a dielectric material, such as silicon dioxide (SiO2) or silicon nitride (SiNx) to enhance stability.

After etching, the top electrode 818 is deposited or formed on top of the MTJs 820 and 822. The embodiment of FIG. 7, as the embodiments of FIGS. 6, 5, and 1 store two bits of information, with one bit stored in each MTJ. Thus, the MTJ 820 is for storing one bit and the MTJ 822 is for storing another bit of information. However, more bits may be stored by adding MTJs. In FIG. 7, additional MTJs may be added on top of the layer 804 or the MTJs 820 and 822. With the addition of MTJs, beyond that which is shown in FIG. 7, additional trenches are formed between the MTJs, such as the trench 824.

Table 2 shows certain exemplary characteristics of the embodiment of FIG. 7. It should be noted that similarly, Table 1 shows certain exemplary characteristics of the embodiments of FIGS. 1, 5 and 6.

For example, in Table 2, under the "Total R" column, there is shown the resistance at each state of the memory element 800, such as the state 1, the state 2, the state 3 and the state 4. As previously noted, each state represents a binary value such that four states, and represented by two bits are stored. The programming current, in micro amps, i.e. the current needed to program the memory element 800 to a given state, is indicated in the last column of Table 2, under the label "Prog I".

In an alternative embodiment of the present invention, a non-uniform switching based non-volatile magnetic memory element, such as the non-uniform switching based non-volatile magnetic memory element 100 disclosed in U.S. patent application Ser. No. 11/674,124 entitled "Non-Uniform Switching Based Non-Volatile Magnetic Base Memory", filed on Feb. 12, 2007, may be employed to replace the MTJs of the various embodiments shown and discussed herein. For example, the MTJ 124 or the MTJ 126 may be replaced with a non-uniform switching based non-volatile magnetic memory element. Other MTJs discussed herein may also be replaced with non-uniform switching based non-volatile magnetic memory element. This advantageously further reduces the requisite switching current to enhance system performance.

FIG. 8 shows a program/erase circuit for programming and/or erasing the memory elements of the various embodiments of the present invention. In FIG. 8, a current source 902 is shown coupled to a current mirror circuit 904, which is shown coupled to the switch 906, which is, in turn, shown coupled to the switch 968, which is shown coupled to the multi-state current-switching magnetic memory cell 914, which is shown coupled to the switch 916. Further shown in FIG. 8, a current source 918 is shown coupled to a current mirror circuit 920 and further shown coupled to Vcc on an opposite end thereto. The circuit 920 is further shown coupled to the switch 999.

The circuit 904 is shown to include a P-type transistor 922, a P-type transistor 924 and a P-type transistor 926. The source of each of the transistors 922, 924 and 926 are shown coupled to Vcc. Vcc is at a predetermined voltage level that is higher than ground. The gate of the transistor 922 is shown coupled to the current source 902 and the opposite side of the current source 902 is shown coupled to ground. The drain of the transistor 922 is shown coupled to its gate as well as to the gate of the transistor 924 and the gate of the transistor 926. The drains of the transistors 924 and 926 are shown coupled to the switch 906. The memory cell 914 is shown to include an MTJ 910, an MTJ 912 and an access transistor 940. The MTJ 912 is shown coupled in series to the MTJ 912, which is shown coupled to the drain of the transistor 940. The gate of the transistor 940 is shown coupled to the word line 942. The word line 942 selects a memory cell. The source of the transistor 940 is shown coupled to the switch 916.

While memory cell 914 is shown to include two MTJs coupled in series, it is contemplated that the memory cell 914 can include more than two MTJs and that which would be coupled together in series. In this case, each MTJ may have a different switching current associated therewith.

The circuit 920 is shown to include an N-type transistor 928, an N-type transistor 930 and an N-type transistor 932. The drains of the transistors 928, 930 and 932 are shown coupled to ground. The gate of the transistor 932 is coupled to the current source 918 and is further coupled to the drain of the transistor 932 and is further coupled to the gate of the transistor 930 as well as to the gate of the transistor 928. The drain of the transistors 930 and 928 are shown coupled to the switch 999.

Each of the switches 968 and 916 are shown operative to switch between two states, a program state and an erase state. The switches 906 and 999 are shown operative to switch between two states.

The MTJs 910 and 912 are similar to the MTJs of previous figures, such as those depicted in FIGS. 1 and 6. In an alternative embodiment, the MTJs 910 and 912, coupled in parallel, would be similar to the MTJs shown in FIG. 7. Each MTJ 910 and 912 possesses a resistance of a different or unique value. The difference in their resistance results from the difference in the aspect ratio or size or anisotropy of the MTJs.

The size of the transistor 926 is greater than the size of the transistors 922 and 924. Similarly, the size of the transistor 928 is greater than the size of the transistors 930 and 932. In one embodiment of the present invention, the size difference of the foregoing transistors is 4 to 1. To explain the operation of programming, an example is provided with fixed values but it should be noted that these values may be altered without departing from the scope and spirit of the present invention.

In operation, to program the memory cell 914 to a state 1, a current of level of 50 micro Amps is applied by the current source 902 to the circuit 904, which is amplified to 4× the current level or 200 micro Amps, as shown in Table 1 because the transistor 926 is able to drive this level of current. This causes the switch 906 to switch to the state indicated at 944. The switch 908 is set to 'program' state, as is the switch 916, which causes the 200 micro amp current to flow through the MTJs 910 and 912 and the transistor 940 is selected by raising the voltage on the word line 942. This results in programming of state 1. The magnetic moment of the free layers of the MTJs 910 and 912 will be caused to be aligned with the magnetic moment of that of their respective fixed layers. This results in the lowest resistance of the memory cell 914, as indicated in Table 1.

In programming the memory cell 914 to a state 2, a current of level of 50 micro Amps is applied by the current source 918 to the circuit 920, which is the same current level as that generated by the circuit 920. The current level for state 2 is indicated in Table 1. The switch 999 is caused to be switched to the state indicated at 948. The switches 908 and 916 are both set to 'erase' state, which causes the 50 micro amp current to flow through the MTJs 910 and 912 and the transistor 940 is selected by raising the voltage on the word line 942. This results in programming of state 2. The magnetic moment of the free layer of the MTJ 910 is caused to be switched to an anti-parallel state or a state that is in opposite to being aligned with its respective fixed layer. The MTJ 912 remains in the state it was in at state 1. The reason for this is, that in one embodiment of the present invention, with the aspect ratio of the MTJ 912 being higher than that of MTJ 910, it is prevented from switching. This results in the resistance of the memory cell 914 indicated in Table 1.

In programming the memory cell 914 to a state 3, a current of level of 50 micro Amps is applied by the current source 918 to the circuit 920, which causes the current level, generated by the transistor 928 to be 4 times that of the level of the current source, or 200 micro amps. The current level for state 3 is indicated in Table 1. The switch 910 is caused to be switched to the state indicated at 950. The switches 908 and 916 are both set to 'erase' state, which causes the 200 micro amp current to flow through the MTJs 910 and 912 and the transistor 940 is selected by raising the voltage on the word line 942. This results in programming of state 3. The magnetic moment of the free layers of the MTJs 910 and 912 are caused to be switched to an anti-parallel state relative to their respective fixed layers. This results in the resistance of the memory cell 914 to be that indicated in Table 1.

To program the memory cell 914 to a state 4, a current of level of 50 micro Amps is applied by the current source 902 to the circuit 904, which is the current level of the circuit 904 and that which is indicated in Table 1 for state 4. This causes the switch 906 to switch to the state indicated at 946. The switch 908 is set to 'program' state, as is the switch 916, which causes the 50 micro amp current to flow through the MTJs 910 and 912 and the transistor 940 is selected by raising the voltage on the word line 942. This results in programming of state 4. The magnetic moment of the free layer of the MTJ 910 will be caused to be aligned with the magnetic moment of that of its respective fixed layer. The MTJ 912 remains in its anti-parallel state, the reason for this is due the difference in the aspect ratios of the two MTJs as discussed hereinabove. This results in a resistance of the memory cell 914 indicated in Table 1.

FIG. 9 shows a read circuit for reading the memory elements of the various embodiments of the present invention. FIG. 9 is shown to include a memory cell 1002 coupled to a sense amplifier circuit 1004, which is shown coupled to a reference circuit 1006. The memory cell 1002 is shown to include an access transistor 1008, an MTJ 1010 and an MTJ 1012. The transistor 1008 is shown to have a drain, a source and a gate. The gate of the transistor 1008 is shown coupled to a word line 1014, the drain of the transistor is shown coupled to ground and the source of the transistor is shown coupled to the MTJ 1010.

It should be noted that wherever values are indicated herein, they are to merely serve as examples with the understanding that other suitable values are anticipated. It is further noted that while reference is made to an N-type or P-type transistor, either type or other suitable types of transistors may be employed, as the type of transistor indicated in the foregoing embodiments, merely serve as examples.

The circuit 1006 is shown to include a number of state reference circuits, indicated as state reference circuit 1020, 1022 and 1024. Each of the circuits 1020-1024 includes an access transistor and a reference resistor. For example, the circuit 1020 is shown to include a reference resistor 1026 coupled on one side to the circuit 1004 and Vcc and on the other side to the drain of an access transistor 1028. The gate of the transistor 1028 is shown coupled to a select signal, namely select 1 signal 1040.

Similarly, the circuit 1022 is shown to include a reference resistor 1030 coupled on one side to the circuit 1004 and Vcc and on the other side to the drain of an access transistor 1032. The gate of the transistor 1032 is shown coupled to a select signal, namely the select 2 signal 1042. The circuit 1024 is shown to include a reference resistor 1034 coupled on one side to the circuit 1004 and Vcc and on the other side to the drain of an access transistor 1036. The gate of the transistor 1044 is shown coupled to a select signal, namely the select 3 signal 1044.

The MTJs 1010 and 1012, as stated relative to FIG. 8, are similar to the MTJs of the embodiments of the present invention except that in the case of FIG. 7, the MTJs of the read circuit would be coupled in parallel rather than in series, shown in FIG. 9.

During a read operation, the memory cell 1002 is selected by raising the voltage of the word line 1014. The circuit 1004 compares the total resistance of the MTJs 1010 and 1012 with the resistances of the reference resistors of the state reference circuits. For example, the resistance of the MTJs 1010 and 1012 (collectively or added together) is compared to the resistance of the resistor 1026 and if it is determined to be less, the state of the memory cell 1002 is declared as binary value '00' or perhaps, state 1. However, if the resistance of the MTJs 1010 and 1012, collectively, is determined to be higher than that of the resistor 1026, the former is then compared to the resistance of the resistor 1030 and there again, if the resistance of the MTJs 1010 and 1012 is less than the resistor 1030, the state 2 or binary value '01'. If the resistance of the MTJs 1010 and 1012 is determined to be greater than the resistor 1030, the resistance of the MTJs 1010 and 1012 is compared to the resistance of the resistor 1034 and if the resistance of the former is determined to be lower, the state 3 or binary value '10' is declared (or read), otherwise, the state 4 or binary value '11' is declared.

The select signal of each of the circuits 1020-1024 are used to select the corresponding circuit. For example, to compare the resistance of the MTJs to the resistance of the resistor 1026, the signal 1040 is activated thereby turning on the transistor 1028. In the meanwhile, the remaining transistors of the circuit 1006 are off. Similarly, to compare the resistance of the MTJs to the resistance of the resistor 1030, the signal 1042 is activated thereby turning on the transistor 1032. In the meanwhile, the remaining transistors of the circuit 1006 are off. To compare the resistance of the MTJs to the resistance of the resistor 1034, the signal 1044 is activated thereby turning on the transistor 1036. In the meanwhile, the remaining transistors of the circuit 1006 are off.

Examples of resistance values of the reference resistors are averages of the resistances of the MTJs 1010 and 1012. For example, the resistance of the resistor 1026 is the average of the resistances of the MTJs 1010 and 1012 at the states 1 and 4, as indicated in Table 1. The resistance of the resistor 1030 is the average of the resistances of the MTJs 1010 and 1012 at the states 2 and 4, as indicated in Table 1. The resistance of the resistor 1034 is the average of the resistances of the MTJs 1010 and 1012 at the states 2 and 3, as indicated in Table 1. For example, in one embodiment of the present invention, the resistor 1026 has a resistance of 3.5 kilo-ohm, which is the average of 3 and 4 kilo-ohms. The resistance of the resistor 1030 is 4.5 kilo-ohms, which is the average of 5 and 4 kilo-ohms and the resistance of the resistor 1034 is 5.5 kilo-ohms, which is the average of 5 and 6 kilo-ohms.

In various embodiments of the present invention, some of which are disclosed hereinbelow, a STTMRAM using two or more MTJs having perpendicular orientations or a combination of perpendicular and longitudinal MTJs, placed in the close proximity to each other is disclosed. One of the characteristics of such a STTMRAM is to advantageously have multiple resistances associated therewith allowing for the storage of multiple states, thereby having smaller cell size.

At smaller litho dimensions the magnetic memory bits would have substantially perpendicular orientation of the magnetization direction.

Bottom MTJ (or stack) is a memory structure where the fixed layer is formed below the free layer during MTJ fabrication and a top MTJ (or stack) is memory structure where the fixed layer is formed on top of the free layer during MTJ fabrication.

FIG. 10 shows a multi-state spin-torque transfer magnetic random access memory (STTMRAM) 1100, in accordance with an embodiment of the present invention. The multi-state STTMRAM memory 1100 is shown to include bottom electrode (BE) 1104, underlayer 1106, fixed layer 1108, spin polarization enhanced (interface) layers (SPEL) 1110 and 1114, free layer 1118, cap layer 1120, non-magnetic spacing layer 1122, underlayer 1128, fixed layer 1130, SPEL 1134, tunneling layer 1136, SPEL 1138, free layer 1140, cap layer 1141 and top electrode (TE) 1143.

Underlayer 1106 is shown formed on top of BE 1104, which is generally formed on a substrate or film (or a metal post or line such as tungsten, aluminum or copper for) of a typical integrated circuit. Fixed layer 1108 is shown formed on top of fixed layer 1108 and SPEL layer 1110 is shown formed on top of fixed layer 1108.

In some embodiments, SPEL 1110 is a part of fixed layer 1108. In some embodiments, SPEL 1114 is a part of free layer 1118.

Referring still to FIG. 10, tunneling layer 1112 is shown formed on top of SPEL 1110, SPEL 1114 is shown formed on top of tunneling layer 1112, free layer 1118 is shown formed on top of SPEL 1114, cap layer 1120 is shown formed on top of free layer 1118, non-magnetic spacing layer 1122 is shown formed on top of cap layer 1120, underlayer 1128 is shown formed on top of non-magnetic spacing layer 1122, fixed layer 1130 is shown formed on top of underlayer 1128, SPEL 1134 is shown formed on top of fixed layer 1130, tunneling layer 1136 is shown formed on top of SPEL 1134, SPEL 1138 is shown formed on top of tunneling layer 1136, free layer 1140 is shown formed on top of SPEL 1138, cap layer 1141 is shown formed on top of free layer 1140 and TE 1143 is shown formed on top of cap layer 1141.

Magnetic tunnel junction (MTJ) 1124 comprises fixed layer 1108, SPEL 1110, tunneling layer 1112, SPEL 1114 and free layer 1118. MTJ 1126 comprises fixed layer 1130, SPEL 1134, tunneling layer 1136, SPEL 1138 and free layer 1140. In this manner, MTJ 1126 and MTJ 1124 are stacked. While MTJ 1124 and MTJ 1126 are each shown to have a bottom stacking structure with their respective free layers formed above their fixed layers, alternatively, they may have a top stacking structure where their respective fixed layers are formed above their free layers.

While two MTJs are shown in FIG. 10, it is understood that any number of MTJs may be stacked.

SEPL 1134, tunneling layer 1136 and SPEL 1138, are collectively referred to as sub-magnetic tunnel junction (sub-MTJ) layer 1132. Similarly, SEPL 1110, tunneling layer 1112 and SPEL 1114 are collectively referred to as sub-magnetic tunnel junction (sub-MTJ) layer 1159.

ULs 1106 and 1128, in some embodiments, may be multi-layered with one or more layers of underlayer or at least one layer of seed layer. Seed layers are well known to those skilled in the art.

In some embodiments, SPELs are not employed in either of MTJs 1124 or 1126, in other embodiments, one of the MTJs 1124 or 1126 employs SPELs and another does not. In yet another embodiment, only one SPEL is used adjacent to the tunneling layer. That is, for example, only SPEL 1110 is used and SPEL 1114 is absent or only SPEL 1114 is used and SPEL 1110 is absent. In yet other embodiments, as discussed above, SPEL is part of an adjacent layer. For example, SPEL 1134 is part of fixed layer 1130 or SPEL 1138 is part of free layer 114 or SPEL 1134 is part of fixed layer 1130 and SPEL 1138 is part of free layer 1140.

The functions of BE 1104 and TE 1143 are as known to those skilled in the art. Fixed layers 1108 and 1130 each have a magnetization direction (or orientation) that is fixed at the time of manufacturing and throughout the operational lifetime of the multi-state STTMRAM cell 1100. The magnetization direction of each of the free layers 1118 and 1140 switches between a parallel state and an anti-parallel state relative to the magnetization direction of each of their respective fixed layers during operation of the multi-state STTM- RAM 1100. In fact, the parallel and anti-parallel states define the logical state of a free layer which define the logical state of the corresponding MTJ. For example, free layer 1118's magnetization state being in a parallel state relative to fixed layer 1108 defines a different logical state than free layer 1118's magnetization direction being in an anti-parallel state relative to fixed layer 1108. An example of logic states are '0' or '1'.

The direction of magnetization of fixed layer 1108, which is shown by the arrow 1123, is fixed in the direction of the arrow 1123 and it is perpendicular to the surface of the substrate onto which the multi-state STTMRAM 1100 is formed. The direction of magnetization of free layer 1118, which switches relative to that of fixed layer 1108, as shown by the arrow 1127, is also perpendicular to the plane of the substrate.

In some embodiments, the thickness of each of underlayers 1106 and 1128 is typically between 5 nano meters (nm) to 50 nm and may comprise a seedlayer underneath or in between BE 1104 and underlayer 1106 and in between non-magnetic spacing layer 1122 and underlayer 1128. In some embodiments, the seedlayer thickness is 2 nm to 50 nm. In some embodiments, fixed layers 1108 and 1130 are 2 nm to 100 nm. In some embodiments, the thickness of SPEL layer is typically less than 5 nm. In some embodiments, the thickness of each of the free layers 1118 and 140 is typically 1 to 10 nm. In some embodiments, the thickness of each of tunneling layers 1112 and 1136 is typically 0.5 to 3.0 nm. In some embodiments, the thickness of non-magnetic isolation layer 1122 is 5 nm-100 nm. In some embodiments, the thickness of caplayer 1141 is 2 to 100 nm and typically 5 to 50 nm. In some embodiments, the thickness of top electrode 1143 and bottom electrode choice and thickness depend on the device design and are typically thicker than 10 nm.

The material of which each of the underlayers 1106 and 1128 is made of are typically chosen from alloys of one or more of the elements chosen from tantalum (Ta), chromium (Cr), titanium (Ti), molybdenum (Mo), tungsten (W), boron (B), copper (Cu), nitrogen (N), nickel (Ni), carbon (C), phosphorus (P), iron (Fe), or cobalt (Co) and should be conducting and non-magnetic. Fixed layers 1108 and 1130 are each generally alloys of iron (Fe) nickel (Ni) cobalt (Co), platinum (Pt), copper (Cu), boron (B), tantalum (Ta), titanium (Ti), chromium (Cr) including rare earth alloys like terbium (Tb), samarium (Sm), neodymium (Nd), and gadolinium (Gd). In one embodiment, the magnetic alloy also contains one or more of silicon oxide ($SiO_2$), titanium oxide ($TiO_2$), tantalum oxide ($Ta_2O_5$), and aluminum oxide ($Al_2O_3$). In yet another embodiment, each of the fixed layers 1108 and 1130 is comprised of multi-layers made of Co and Pt with each of the Co and/or Pt layers of each of the multi-layers typically having a thickness of 0.3 nm-2 nm, and the total number of each of the Co and/or Pt layers being less than 10. The choice of material for each of SPEL layers 1110, 1114, 1134 and 1138, in some embodiments, is an alloy of Co(20-80 at %)Fe(20-80 at %)B (8-25 at %) such that the as-deposited SPEL layer is >80 volume percent amorphous. The choice of material for each of tunneling layers 1112 and 1136 is one or combinations from aluminum oxide ($Al_2O_3$), titanium oxide ($TiO_2$), magnesium oxide (MgO), strontitum oxide (SrO), or ruthenium oxide (RuO). Cap layers 1120 and 1141 are each a nonmagnetic alloy and conducting of one or more of the elements selected from tantalum (Ta), chromium (Cr), tungsten (W), titanium (Ti), zirconium (Zr), niobium (Nb), copper (Cu), or aluminum (Al).

The function UL 1106 is to provide the proper crystal structure template in order to grow the adjacent and subsequent magnetic fixed layers 1108 and 1130 having perpendicular orientation in a direction shown by arrow 1123. This is typically characterized by measuring the delta theta 50 of the preferred easy axis. As known to those skilled in the art, this is carried out typically by using an x-ray diffractometer such as one designed by Rigaku Coporation, Tokyo, Japan. A smaller delta-theta 50 indicates, such as typically below 5 degrees, a more oriented film. A typical value of the delta-theta50 is below 10 degrees. The function of SPEL layer is to enhance the tunneling magneto-resistance (TMR) of the MTJs through proper crystal structure matching during the magnetic annealing process.

The function of fixed layers 1108 and 1130 is to act as a reference layer for respective magnetic tunnel junction (MTJ). For example, fixed layer 1108 acts as a reference layer with fixed magnetic orientation for MTJ 1124 and fixed layer 1140 acts as a reference layer with fixed magnetic orientation for MTJ 1126.

The function of each of tunneling layers 1112 and 1136 is to act as spin-filter layer for the spin tunneling for the MTJ which is important to get high TMR. More specifically, the tunneling layers selectively filter the spin states of the polarized conduction electrons as they travel through the fixed layer to the free layer and vice versa. A detailed description of this can be found in the published paper, "Theory of Tunneling Magnetoresistance For Epitaxial Systems by W. H. Butler, X. G. Zhang, S. Vutukuri, M. Chchiev and T. C. Schulthess, IEEE Trans Mag., vol. 41, No. 10, October 2005".

The function of each of free layers 1118 and 1140 is to switch between magnetic orientations (states) when current is applied to the multi-state STTMRAM thereby storing a state. The free layer is critical to its corresponding MTJ in that it causes the MTJ to exhibit high tunneling magneto resistance (TMR) characteristic. The design and the material of choice used for making the free layer determines, at least in part, the programming current of the multi-state STTMRAM as well as device reliability, more specifically the thermal stability.

While STTMRAM 1100 is shown to include two MTJs, in other embodiments, it may include more than two MTJs. In fact, any number of MTJs may be employed in any of the STTMRAM of the various embodiments of the present invention. In the case where more than two MTJ are employed, a unique switching current switches the state of each MTJ. For example, a STTMRAM with three MTJs, coupled in series, and coupled to an n-channel MOSFEL (NMOS) type of access transistor may exhibit switching currents of 75 micro Amps for one MTJ, 50 micro Amps for a second MTJ and 25 micro Amps for the third MTJ.

It is noted that an MTJ is a variable resistive element. In this regard, any of the MTJs discussed and/or shown herein may be replaced with a variable resistive element without departing from the scope and spirit of the present invention.

In operation, during a write operation, electric current is applied in a direction that is either from BE 1104 through the subsequent layers that are on top of BE 1104 or in a direction from TE 1143 through the subsequent layers formed below TE 1143.

It is noted that the direction of magnetization of the free and fixed layers of the MTJs in the FIGS. 10 through 25 is indicated by the direction of the arrows used therein.

FIG. 11 shows a multi-state STTMRAM 1153, in accordance with an alternative embodiment of the present invention. The multi-state STTMRAM 1153 includes MTJ 1126, which is shown formed on top of the anti-ferromagnetic (AFM) layer 1128, which is shown formed top of UL 1150 The top portion of the multi-state STTMRAM 1153, i.e., the layers on top of the fixed layer 1130 are analogous to common layers of that of multi-state STTMRAM 1100.

Anti-ferromagnetic (AFM) layer 1128 is shown formed on top of UL 1150, which is shown formed on top of non-magnetic spacing layer 1152 which is formed on top of the cap layer 1120, which is shown formed on top of free layer 1118, which is shown formed on top of SPEL 1114. The layers formed below SPEL 1114 are analogous to that of like locations of multi-state STTMRAM 1100. AFM layer 1148 is shown formed between UL 1106 and fixed layer 1108. UL 1106 is shown formed on top of BE 1104, which is typically formed on film or substrate of an integrated circuit. In this respect, the embodiment of FIG. 11 is analogous to that of FIG. 10 except that each AFM layer separates its respective MTJ from the corresponding UL.

Each of the AFM layer is used to establish perpendicular orientation of its respective fixed layer. In some embodiments, each of the AFM layer 1148 and 1128 is made of material chosen from one or more of the following: Iridium manganese (IrMn), platinium manganese (PtMn), nickel manganese (NiMn) and iron manganese (FeMn) and has atypical thickness between 2 to 50 nm.

FIG. 12 shows a multi-state STTMRAM 1155, in accordance with an alternative embodiment of the present invention. Layers 1128, 1122, 1120, 1118, 1114, 1112, 1110, 1108, 1106 and 1104 are analogous to those of multi-state STTM-RAM 1100. On top of UL 1128, there is shown formed fixed layer 1130 and on top of fixed layer 1130, there is shown formed SPEL 1134. On top SPEL 1134, three is shown formed tunneling layer 1136 and on top of tunneling layer 1136, there is shown formed SPEL 1138. On top of SPEL 1138, there is shown formed free layer 1140 and on top of free layer 1140, there is shown formed AFM layer 1154. On top of AFM layer 1154, there is shown formed cap layer 1141 and on top of cap layer 1141, there is shown formed TE 1143.

AFM layer 1154 is analogous to AFM layers 1148 and 1128.

FIG. 13 shows a multi-state STTMRAM 1160, in accordance with an alternative embodiment of the present invention. The multi-state STTMRAM 1160 is shown to include MTJ 1124, formed on top of UL 1106, which is formed on top of BE 1104, as in the embodiment of FIG. 10. On top of MTJ 1124 is shown formed cap layer 1120 on top of which is formed non-magnetic spacing layer 1122. On top of non-magnetic spacing layer 1122 is shown formed UL 1128. On top of UL 1128 is shown formed fixed layer 1130 and on top of fixed layer 1130 is shown formed sub-MTJ stack 1132. On top of sub-MTJ stack 1132 is shown formed a composite free layer 1157. Composite free layer 1157 comprises of layers 1158, layer 1160 and layer 1156. Each of layers 1158 and 1156 is analogous to layer 1118.

Layer 1160 is also known as a nano-current channel (NCC) layer and is comprised of magnetic and non-magnetic regions as depicted by the darker rectangles and white or no-color rectangles. The darker rectangular regions represent the magnetic regions and the while rectangular regions represent the non-magnetic regions although vice versa is contemplated. The magnetic part is typically an alloy of one or more of the elements chosen from Co, Fe, Ni, Ti, Ta, Cr, Si, B, P, C, W, Al, Zr and the non-magnetic portion is one or more of oxides, nitrides and phosphides of Al, Si, Ti, Ta, W, Zr.

The layers 1158, 1160 and 1162, in combination, are referred to herein as composite free layer 1157, as are similarly structured layers where a NCC is formed between two free layers.

In one embodiment, composite free layer 1157 comprises of layers 1158 and 1160. In another embodiment, composite free layer 1157 comprises of layers 1160 and 1156. In a yet another embodiment, composite free layer 1157 comprises of layers 1158, 1160 and 1156, and the layer 1156 is thinner than layer 1158 by more than a factor of two.

It is expected that the MTJ2 1162 of multi-state STTM-RAM 1160 has lower programming current than the MTJ1 1124 by over a factor of two times.

FIG. 14 shows a multi-state STTMRAM 1164, in accordance with another embodiment of the present invention. The top portion of the multi-state STTMRAM 1164 is analogous to the top portion of multi-state STTMRAM 1100. AFM layer 1128 is shown formed on top of UL 1150, which is shown formed on top of the non-magnetic spacing layer 1152 which is formed on top of cap layer 1120, which is shown formed on top of composite free layer 1157, which is shown formed on top of sub-MTJ layer 1159, which is shown formed on top of layer 1108, which is shown formed on top of AFM layer 1148, which is shown formed on top of UL 1106, which is shown formed on top of BE 1104. The layers 1108, sub-MTJ layer 1159 and the composite free layer 1157 form MTJ 1161.

In operation, the MTJ1 1161 requires a lower programming current than the MTJ2 1126.

FIG. 15 shows a multi-state STTMRAM 1166, in accordance with another embodiment of the present invention. In FIG. 15, UL 1106 is shown formed on top of BE 1104. On top of UL 1106 is shown formed MTJ 1124 and on top of MTJ 1124 is shown formed cap layer 1120. On top of cap layer 1120 is shown formed non-magnetic spacing layer 1122 and on top of layer 1122 is shown formed UL 1128. On top of UL 1128 is shown formed composite free layer 1157 and on top of the composite free layer 1157 is shown formed the sub-MTJ layer 1132. On top of sub-MTJ layer 1132 is shown formed fixed layer 1163 and on top of fixed layer 1163 is shown formed AFM layer 1154. On top of AFM layer 1154 is shown formed cap layer 1141 and on top of cap layer 1141 is shown formed TE 1143. The layers 1157, 1132, 1163 and 1154 collectively comprise MTJ 1161.

In the embodiment of FIG. 15, MTJ 1161 is shown formed on top of MTJ 1124 therefore creating a stacked MTJ structure. As with all embodiments shown in FIGS. 10 through 25, while two MTJs are shown to be stacked, in various embodiments of the present invention, any number of MTJs may be stacked.

As earlier stated, the magnetization of fixed layers 1108 and 1163 is in a direction shown by the arrows 1123 and 1126, respectively. In one embodiment, non-magnetic spacer layer 1122 is made thicker than 20 nm to ensure no magnetic interactions between the MTJ 1124 and MTJ 1161.

FIG. 16 shows a multi-state STTMRAM 1170, in accordance with an alternative embodiment of the present invention. In the embodiment of FIG. 16, MTJ 1126 is shown stacked on top of MTJ 1176. MTJ is shown formed on top of UL 1106, which is shown formed on top of BE 1104. Cap layer 1120 is shown formed on top of MTJ 1176 and on top of cap layer 1120 is shown formed non-magnetic spacing layer 1122. On top of non-magnetic spacing layer 1122 is shown formed UL 1128 and on top of UL 1128 is shown formed MTJ 1126. On top of MTJ 1126 is shown formed cap layer 1141 and on top of cap layer 1141 is shown formed TE 1143.

MTJ 1176 is shown formed of fixed layer 1172, SPEL 1171, tunneling layer 1178, SPEL 1173, and free layer 1174. Fixed layer 1172 is formed on top of the AFM layer 1179, which is shown formed on top of the UL 1106. Unlike the MTJs of FIGS. 10 through 15 where the direction of magnetization of the free layers and fixed layers were perpendicular to the surface of the substrate (perpendicular magnetic anisotropy), the direction of magnetization of the free and fixed layers of MTJ 1176 are parallel or in-plane relative to the surface of the substrate on which the a multi-state STTM- RAM 1170 is built. In the case where more than two MTJs are stacked, there may be an MTJ with in-plane magnetic anisotropy formed on top of MTJ 1126 and an MTJ with perpendicular magnetic anisotropy formed on top it and so on with alternating magnetic anisotropy. Alternatively, there may be an MTJ with perpendicular anisotropy formed on top of MTJ 1126 and on top of it is formed an in-plane magnetic anisotropy MTJ where the MTJs of varying magnetic anisotropy skip by two. Alternatively, the MTJs may skip by any number.

FIG. 17 shows a multi-state STTMRAM 1180, in accordance with yet another embodiment of the present invention. In the embodiment of FIG. 17, UL 1106 is shown formed on top of BE 1104 and on top of UL 1106 is shown formed MTJ 1124. On top of MTJ 1124 is shown formed cap layer 1120 and on top of cap layer 1120 is shown formed MTJ 1190. On top of MTJ 1190 is shown formed cap layer 1141 and on top of cap layer 1141 is shown formed TE 1143.

MTJ 1190 is shown comprised of: AFM layer 1187, fixed layer 1183, SPEL 1182, tunneling layer 1184, SPEL 1186 and free layer 1185. Fixed layer 1183 is shown formed on top of AFM layer 1187, SPEL 1182 is shown formed on top of fixed layer 1183, tunneling layer 1184 is shown formed on top of SPEL 1182, SPEL 1186 is shown formed on top of tunneling layer 1184 and free layer 1185 is shown formed on top of SPEL 1186. SPEL 1182, tunneling layer 1184 and SPEL 1186 collectively comprise sub-MTJ layer 1188. As in the embodiment of FIG. 16, non-magnetic spacing layer 1122 separates the two MTJs of FIG. 17.

FIG. 18 shows a multi-state STTMRAM 1192, in accordance with yet another embodiment of the present invention. The multi-state STTMRAM is shown to include BE 1104, UL 1106, AFM layer 1196, fixed layer 1172, sub-MTJ layer 1175, free layer 1174, cap layer 1120, non-magnetic spacing layer 1122, AFM layer 1150, MTJ 1126, cap layer 1141 and TE 1143. In the embodiment of FIG. 18, UL 1106 is shown formed on top of BE 1104, MTJ 1194 is shown formed on top of UL 1106, cap layer 1120 is shown formed on top of MTJ 1194, non-magnetic spacing layer 1122 is shown formed on top of cap layer 1120, non-magnetic spacing layer 1122 is shown formed on top of AFM layer 1150, MTJ 1126 is shown formed on top of AFM layer 1150, cap layer 1141 is shown formed on top of MTJ 1126 and TE 1143 is shown formed on top of cap layer 1141.

Layers 1196, 1172, 1175, free layer 1174 collectively comprise MTJ 1194.

The direction of magnetization of each of the fixed layer 1172 and free layer 1174, of MTJ 1194, is parallel relative to the surface of the substrate onto which multi-state STTMRAM 1192 is made, whereas, the free and fixed layers of MTJ 1126 each have a direction of magnetization that is perpendicular to the plane of the substrate onto which multi-state STTMRAM 1192 is formed. Accordingly, the embodiment of FIG. 18 shows an MTJ with a perpendicular magnetic anisotropy formed on top of one having an in-plane magnetic anisotropy.

FIG. 19 shows multi-state STTMRAM 1200, in accordance with an alternative embodiment of the present invention. The multi-state STTMRAM 1200 is shown to include BE 1104, UL 1106, MTJ 1124, cap layer 1120, non-magnetic spacing layer 1122, MTJ 1190, cap layer 1141 and TE 1143. MTJ 1190 is shown to include AFM layer 1250, fixed layer 1240, sub-MTJ layer 1232 and free layer 1230. The sub-MTJ layer 1232 is shown to include SPEL 1238, tunneling layer 1236 and SPEL 1234.

UL 1106 is shown formed on top of BE 1104. MTJ 1124 is shown formed on top of UL 1106, cap layer 1120 is shown formed on top of MTJ 1124, non-magnetic spacing layer 1122 is shown formed on top of cap layer 1120, and MTJ 1190 is shown formed on top of non-magnetic spacing layer 1122. Cap layer 1141 is shown formed on top of MTJ 1190 and TE is shown formed on top of cap layer 1141.

More specifically, AFM layer 1250 is shown formed on top of non-magnetic spacing layer 1122, fixed layer 1240 is shown formed on top of AFM layer 1250, SPEL 1238 is shown formed on top of fixed layer 1240, tunneling layer is shown formed on top of SPEL 1238, SPEL 1234 is shown formed on top tunneling layer 1236 and free layer 1230 is shown formed on top of SPEL 1234.

The direction of magnetization of each of free layer 1230 and fixed layer 1240 is in-plane relative to the plane of the substrate. Accordingly, the embodiment of FIG. 19 shows an MTJ with an in-plane magnetic anisotropy formed on top of one having a perpendicular magnetic anisotropy.

FIG. 20 shows multi-state STTMRAM 1300, in accordance with another embodiment of the present invention. In the embodiment of FIG. 20, multi-state STTMRAM memory 1300 is shown to include BE 1104, UL 1106, MTJ 1194, cap layer 1120, non-magnetic spacing layer 1122, UL 1128, MTJ 1162, cap layer 1141 and TE 1143. UL 1106 is shown formed on BE 1104, MTJ 1194 is shown formed on top of UL 1106, cap layer 1120 is shown formed on top of MTJ 1194, non-magnetic spacing layer 1122 is shown formed on top of cap layer 1120, UL 1128 is shown formed on top of non-magnetic spacing layer 1122, MTJ 1162 is shown formed on top of UL 1128, cap layer 1141 is shown formed on top of MTJ 1162, cap layer 1141 is shown formed on top of MTJ 1162 and TE is shown formed on top of cap layer 1141.

In FIG. 20, the magnetic anisotropy of each of the free and fixed layers of MTJ 1162 is perpendicular and the magnetic anisotropy of each of the free and fixed layers of MTJ 1194 is in-plane.

FIG. 21 shows multi-state STTMRAM 1400, in accordance with another embodiment of the present invention. In the embodiment of FIG. 21, multi-state STTMRAM 1400 is shown to include BE 1104, UL 1106, MTJ 1161, cap layer 1120, non-magnetic spacing layer 1122, UL 1128, MTJ 1190, cap layer 1141 and TE 1143. UL 1106 is shown formed on BE 1104, MTJ 1161 is shown formed on top of UL 1106, cap layer 1120 is shown formed on top of MTJ 1161, non-magnetic spacing layer 1122 is shown formed on top of cap layer 1120, UL 1128 is shown formed on top of non-magnetic spacing layer 1122, MTJ 1190 is shown formed on top of UL 1128, cap layer 1141 is shown formed on top of MTJ 1190, cap layer 1141 is shown formed on top of MTJ 1190 and TE is shown formed on top of cap layer 1141.

In FIG. 21, the magnetic anisotropy of each of the free and fixed layers of MTJ 1190 is in-plane and the magnetic anisotropy of each of the free and fixed layers of MTJ 1161 is perpendicular.

FIG. 22 shows multi-state STTMRAM 1500, in accordance with another embodiment of the present invention. In the embodiment of FIG. 22, multi-state STTMRAM 1500 is shown to include BE 1104, UL 1106, MTJ 1502, cap layer 1120, non-magnetic spacing layer 1122, UL 1150, AFM layer 1128, MTJ 1126, cap layer 1141 and TE 1143. UL 1106 is shown formed on BE 1104, MTJ 1502 is shown formed on top of UL 1106, cap layer 1120 is shown formed on top of MTJ 1502, non-magnetic spacing layer 1122 is shown formed on top of cap layer 1120, UL 1150 is shown formed on top cap layer 1120, AFM layer 1128 is shown formed on top of UL 1150, MTJ 1126 is shown formed on top of AFM layer 1128, cap layer 1141 is shown formed on top of MTJ 1126, and TE 1143 is shown formed on top of cap layer 1141.

MTJ 1502 is shown to include AFM layer 1196, fixed layer 1172, sub-MTJ layer 1175, free layer 1512 and composite free layer 1514. Composite free layer 1514 is shown to include free layer 1169, NCC 1510 and free layer 1514. The free layers positioned above and below the NCC layer are sometimes referred to as "sub-free layers". For example, free layer 1169 and free layer 1508 may be each referred to as sub-free layer 1169 and sub-free layer 1508, respectively.

AFM layer 1196 is shown formed on top of UL 1106, fixed layer 1172 is shown formed on top of AFM layer 1196, sub-MTJ layer 1175 is shown formed on top of fixed layer 1172, free layer 1512 is shown formed on top sub-MTJ layer 1175, composite free layer 1514 is shown formed on top of free layer 1172, and cap layer 1120 is shown formed on top of composite free layer 1514. Composite free layer 1514 is formed of NCC 1510 formed on top of free layer 1169 and free layer 1508 is shown formed on top of NCC 1510. In one embodiment, the layer 1172 is In FIG. 22, the magnetic anisotropy of each of the layers 1172 and 1512 is in-plane while the magnetic anisotropy of each of the free and fixed layers of MTJ 1126 is perpendicular.

FIG. 23 shows multi-state STTMRAM 1600, in accordance with another embodiment of the present invention. In the embodiment of FIG. 23, multi-state STTMRAM 1600 is shown to include BE 1104, UL 1106, MTJ 1124, cap layer 1120, non-magnetic spacing layer 1122, UL 1128, MTJ 1602, cap layer 1141 and TE 1143. UL 1106 is shown formed on BE 1104, MTJ 1124 is shown formed on top of UL 1106, cap layer 1120 is shown formed on top of MTJ 1124, non-magnetic spacing layer 1122 is shown formed on top of cap layer 1120, MTJ 1602 is shown formed on top of non-magnetic spacing layer 1122 cap layer 1141 is shown formed on top of MTJ 1602, and TE 1143 is shown formed on top of cap layer 1141.

MTJ 1602 is analogous except that it is formed on top of MTJ 1124 and more specifically, on top of non-magnetic spacing layer 1122. Thus, NCC 1606 is analogous to NCC 1514.

In FIG. 23, the magnetic anisotropy of each of the free and fixed layers of MTJ 1602 is in-plane and the magnetic anisotropy of each of the free and fixed layers of MTJ 1124 is perpendicular.

FIG. 24 shows multi-state STTMRAM 1700, in accordance with another embodiment of the present invention. In the embodiment of FIG. 24, multi-state STTMRAM 1700 is shown to include BE 1104, UL 1106, MTJ 1161, cap layer 1120, non-magnetic spacing layer 1122, UL 1128, MTJ 1162, cap layer 1141 and TE 1143. UL 1106 is shown formed on BE 1104, MTJ 1161 is shown formed on top of UL 1106, cap layer 1120 is shown formed on top of MTJ 1161, non-magnetic spacing layer 1122 is shown formed on top of cap layer 1120, UL 1128 is shown formed on top of non-magnetic spacing layer 1122, MTJ 1162 is shown formed on top of UL 1128, cap layer 1141 is shown formed on top of MTJ 1162, and TE 1143 is shown formed on top of cap layer 1141.

In FIG. 24, the magnetic anisotropy of each of the free and fixed layers of MTJ 1161 is perpendicular and the magnetic anisotropy of each of the free and fixed layers of MTJ 1162 is perpendicular. It should be noted that in some embodiments, the NCC of each of the composite free layers of the MTJs 1161 and 1162 include different amounts of non-magnetic alloys. In another embodiment, the NCC of each of the composite free layers of the MTJs 1161 and 1162 is made of essentially similar alloys but have different thickness.

FIG. 25 shows multi-state STTMRAM 1800, in accordance with another embodiment of the present invention. In the embodiment of FIG. 25, multi-state STTMRAM 1800 is shown to include BE 1104, UL 1106, MTJ 1502, cap layer 1120, non-magnetic spacing layer 1122, AFM layer 1154, MTJ 1162, cap layer 1141 and TE 1143. UL 1106 is shown formed on BE 1104, MTJ 1502 is shown formed on top of UL 1106, cap layer 1120 is shown formed on top of MTJ 1502, non-magnetic spacing layer 1122 is shown formed on top of cap layer 1120, AFM layer 1154 is shown formed on top of non-magnetic spacing layer 1122, MTJ 1162 is shown formed on top of UL 1128, cap layer 1141 is shown formed on top of MTJ 1162, and TE 1143 is shown formed on top of cap layer 1141.

In FIG. 25, the magnetic anisotropy of each of the free and fixed layers of MTJ 1502 is in-plane and the magnetic anisotropy of each of the free and fixed layers of MTJ 1162 is perpendicular.

While various combinations of MTJs are shown in FIGS. 10 through 25, such as in-plane, perpendicular, with/without AFM layer, with/without NCC, and the like, various other combinations and configurations of MTJs are contemplated.

In each of the embodiments of FIGS. 10 through 25, while two MTJs are shown, any number of MTJs may be employed. Moreover, the perpendicular vs. in-plane MTJs not only may alternate but they may also be every configured to be of the same orientation for some number of MTJs that are stacked on top of each other prior to a MTJ having an opposite orientation being formed thereon. Any such combination is contemplated.

FIG. 26 shows a flow chart of the steps performed, during a write or program operation, to write/program one or more of the MTJs of the various embodiments of the present invention. In FIG. 26, process 1900 outlines relevant steps of the write operation.

In one embodiment of the present invention, the steps of process 1900 of FIG. 16 are performed by the program/erase circuit 900 of FIG. 8. At step 1902, data to be programmed is received. Next, a determination is made at 1904 as to whether or not the most significant bit (MSB) of the received data is the value '0' and if so, process 1900 proceeds to step 1908, otherwise, process 1900 proceeds to step 1906. At step 1906, a negative high (H) current is applied to the MTJ or memory cell being programmed. In one embodiment, the memory cell sought to be programmed is MTJ 912, in other embodiments, the MTJ sought to be programmed is any one of the memory cells that include one or more of the MTJs of the various embodiments of the present invention.

Negative H current, as used herein, refers to sufficient negative current allowing switching (or changing states) of an MTJ having no NCC and being programmed. Negative low current, as used herein, refers to sufficient negative current allowing switching (or changing states) of an MTJ having NCC and being programmed. Positive H current, as used herein, refers to sufficient positive current allowing switching (or changing states) of an MTJ not having NCC and being programmed. Positive low current, as used herein, refers to sufficient positive current allowing switching (or changing states) of an MTJ including NCC and being programmed.

Referring back to process 1900, at step 1908, positive H current is applied to the MTJ being programmed. Next, after step 1908, a determination is made at 1910 as to whether or not the least significant bit (LSB) of the received data is zero and if not, process 1900 proceeds to step 1920, otherwise, process 1900 proceeds to step 1914. At step 1920, a negative low current is applied to the MTJ being programmed at step 1914, no current or zero current is applied to the MTJ being programmed. After step 1914, process 1900 proceeds to the end of the programming step 1922. Similarly, after step 1920, process 1900 proceeds to the end of the programming step 1922.

After step 1906, a determination is made at 1912 as to whether or not the LSB of the received data is zero and if not, process 1900 proceeds to step 1918, otherwise, process 1900 proceeds to step 1916. At step 1918, zero or no current is applied to the MTJ being programmed at step 1916, positive low current is applied to the MTJ being programmed. After step 1916, process 1900 proceeds to the end of the programming step 1922. Similarly, after step 1918, process 1900 proceeds to the end of the programming step 1922.

In alternative embodiments of the present invention, the MTJs (or memory elements) disclosed in U.S. patent application Ser. No. 11/674,124 entitled "Non-Uniform Switching Based Non-Volatile Magnetic Base Memory", filed on Feb. 12, 2007, may be employed in the embodiments of FIGS. 8 and 9 herein.

It should be noted that the objects of the drawings or figures discussed and presented herein are not necessarily drawn to scale.

In some embodiment, those free or fixed layers of the STTMRAMs 1100, 1153, 1155, 1160, 1164, 1166 and 1700 that have perpendicular orientation, as shown in the FIGS. 10, 11, 12, 13, 14, 15 and 24, have largely a circular (or cylindrical) shape in-plane. This is further described in US Patent Publication No. US 2008/019125 entitled, "Non-Volatile Magnetic Memory With Low Switching Current And High Thermal Stability", the contents of which is incorporated herein by reference as though set forth in full. This is particularly useful during manufacturing of such STTMRAM, especially for smaller feature sizes such as below 90 nano meters (nm) because the in-plane STTMRAM typically requires an elongated shape such as rectangular or ellipse, having an aspect ratio of two or three; such designs are difficult to form with high degree of uniformity for smaller feature sizes below 90 nm and pose a greater design and cost challenge for the photo-masks required for printing such structures. The perpendicular STTMRAM, on the other hand, requires an aspect ratio closer to one and this does not require special designs for the photo-mask requiring high-aspect ratio shape control like the in-plane STTRAM.

In some embodiments, where the STTMRAMs 1170, 1180, 1192, 1200, 1300, 1400, 1500, 1600 and 1800 have both longitudinal (or in-plane) and perpendicular MTJs, as shown in FIGS. 16, 17, 18, 19, 20, 21, 22, 23 and 25, the preferred in-plane shape is rectangular or ellipsoid as shown in FIG. 27(*b*). It is likely that such designs may not be scalable well below 65 nm feature size for the reasons mentioned above.

FIG. 27(*a*) shows top-down or in-plane view and side-view of shapes that any of the STTMRAMs 1100, 1153, 1155, 1160, 1164, 1166 or 1700 can have when their free and fixed layers have perpendicular magnetic orientation. In this case, the shape of the STTMRAM is substantially circular or cylindrical.

FIG. 27(*b*) shows top-down or in-plane view and side-view of shapes that any of the STTMRAMs 1170, 1180, 1192, 1200, 1300, 1400, 1600 or 1700 can have when their free and fixed layers have in-plane (or longitudinal) magnetic orientation. In this case, the shape of the STTMRAM is substantially oval or rectangular.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A multi-state spin-torque transfer magnetic random access memory (STTMRAM) formed on a film and configured to store information upon switching current flowing therethrough causing at least one layer thereof to switch its magnetic orientation comprising:
   a first magnetic tunneling junction (MTJ) having a first fixed layer, a first sub-magnetic tunnel junction (sub-MTJ) layer formed on top of the first fixed layer, and a first free layer formed on top of the first sub-MTJ layer, the first fixed layer and first free layer each having a first magnetic anisotropy, the first free layer being capable of switching its magnetic anisotropy when switching current flows through the STTMRAM;
   at least one magnetic anisotropy layer formed on top of the first MTJ layer;
   a second MTJ formed on top of the magnetic anisotropy layer and having a second fixed layer, a second sub-MTJ layer and a second free layer, the second sub-MTJ layer formed on top of the second fixed layer, the second free layer formed on top of the second sub-MTJ layer, the second fixed and second free layers each having a second magnetic anisotropy, the second free layer being capable of switching its magnetic anisotropy when switching current flows through the STTMRAM, the first sub-MTJ layer including a first spin polarization enhanced layer (SPEL);
   a first underlayer formed between the magnetic anisotropy layer and the first fixed layer, the first MTJ being formed on top of the first underlayer; and
   a second underlayer formed below the second fixed layer, wherein the first underlayer is operable to provide the proper crystal structure template to grow the first fixed layer and the second underlayer is operable to provide the proper crystal structure template to grow the second fixed layer,
   further wherein at least one of the first or second magnetic anisotropy is perpendicular to the plane of the film.

2. The multi-state STTMRAM, as recited in claim 1, wherein each of the first and second fixed layers is comprised of multi-layer of Co and Pt.

3. The multi-state STTMRAM, as recited in claim 1, the first SPEL is made of an alloy of Co(20-80 at %)F(20-80 at % eB(8-25 at %) such that the as deposited SPEL layer is >80 volume percent amorphous.

4. The multi-state STTMRAM, as recited in claim 1, wherein the first sub-MTJ includes a first tunneling layer and the second sub-MTJ includes a second tunneling layer.

5. The multi-state STTMRAM, as recited in claim 4, wherein each of the first and second tunneling layers is made of one or combinations of a material comprising: aluminum oxide ($Al_2O_3$), titanium oxide ($TiO_2$), magnesium oxide (MgO), strontitum oxide (SrO), or ruthenium oxide (RuO).

6. The multi-state STTMRAM, as recited in claim 1, further including a cap layer formed on top of the first free layer and a second cap layer formed between the magnetic anisotropy layer and the second free layer.

7. The multi-state STTMRAM, as recited in claim 6, wherein the first cap layer and the second cap layer are each a nonmagnetic alloy and conducting of one or more of the elements comprising: tantalum (Ta), chromium (Cr), tungsten (W), titanium (Ti), zirconium (Zr), niobium (Nb), copper (Cu), or aluminum (Al).

8. The multi-state STTMRAM, as recited in claim 1, wherein the first and second underlayers are each made of an alloy formed from one or more of the elements comprising: tantalum (Ta), molybdenum (Mo), boron (B), copper (Cu), nitrogen (N), nickel (Ni), carbon (C), or phosphorus (P), iron (Fe), or cobalt (Co).

9. The multi-state STTMRAM, as recited in claim 1, further including a top electrode (TE) formed on top of the first sub-MTJ.

10. The multi-state STTMRAM, as recited in claim 1, wherein the first and the second magnetic anisotropies are perpendicular to the plane of the film.

11. A method of programming two or more magnetic tunnel junctions (MTJs) comprising:
- determining if a most significant bit (MSB) of a received data, to be stored in a first or second magnetic tunnel junctions (MTJs), is "0";
- if it is determined that the MSB is "0", applying a positive H current to the first or second MTJs and if it is determined that the MSB is not a "0", applying a negative H current to the first or second MTJs;
- if it is determined that the MSB is a "0", after applying the positive H current, determining if a least significant bit (LSB) of the received data is a "0";
- if it is determined that the LSB is not "0", applying a negative low I to the first or second MTJs;
- if it is determined that the MSB is not a "0", after applying the negative H current, determining if the LSB of the received data is a "0";
- if it is determined that the LSB is a "0", applying a positive low current to the first or second MTJs.

* * * * *